United States Patent
Uesaka et al.

(10) Patent No.: US 9,917,271 B2
(45) Date of Patent: *Mar. 13, 2018

(54) LIGHT-EMITTING DEVICE

(71) Applicant: Semiconductor Energy Laboratory Co., Ltd., Atsugi-shi, Kanagawa-ken (JP)

(72) Inventors: Shogo Uesaka, Kanagawa (JP); Nobuharu Ohsawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/482,876

(22) Filed: Apr. 10, 2017

(65) Prior Publication Data

US 2017/0213991 A1 Jul. 27, 2017

Related U.S. Application Data

(63) Continuation of application No. 14/820,814, filed on Aug. 7, 2015, now Pat. No. 9,653,517.

(30) Foreign Application Priority Data

Aug. 8, 2014 (JP) .................. 2014-162549

(51) Int. Cl.
  *H01L 51/52* (2006.01)
  *H01L 27/32* (2006.01)
  *H01L 51/50* (2006.01)

(52) U.S. Cl.
  CPC .......... *H01L 51/504* (2013.01); *H01L 27/322* (2013.01); *H01L 51/5016* (2013.01);
  (Continued)

(58) Field of Classification Search
  CPC combination set(s) only.
  See application file for complete search history.

(56) References Cited

U.S. PATENT DOCUMENTS

| | | |
|---|---|---|
| 5,554,911 A | 9/1996 | Nakayama et al. |
| 6,831,408 B2 | 12/2004 | Hirano et al. |

(Continued)

FOREIGN PATENT DOCUMENTS

| | | |
|---|---|---|
| JP | 06-275381 A | 9/1994 |
| JP | 2001-043980 A | 2/2001 |

(Continued)

OTHER PUBLICATIONS

Kashiwabara.M et al., "29.5L: Late-News Paper: Advanced AM-OLED Display Based on White Emitter With Microcavity Structure", SID Digest '04 : SID International Symposium Digest of Technical Papers, 2004, vol. 35, pp. 1017-1019.

(Continued)

*Primary Examiner* — Mamadou Diallo
(74) *Attorney, Agent, or Firm* — Fish & Richardson P.C.

(57) ABSTRACT

A light-emitting device in which different electrodes in a work function are used in a first light-emitting element and a second light-emitting element are provided. A light-emitting device includes a first light-emitting element and a second light-emitting element. The first light-emitting element includes a first electrode, an EL layer, and a second electrode in this order. The second light-emitting element includes a third electrode, the EL layer, and the second electrode in this order. The EL layer includes a first light-emitting layer, a layer, and a second light-emitting layer in this order. The structure of the first light-emitting layer is different from the structure of the second light-emitting layer. The first light-emitting element and the second light-emitting element are different in a carrier-injection property.

25 Claims, 17 Drawing Sheets

(52) U.S. Cl.
CPC ...... *H01L 51/5218* (2013.01); *H01L 51/5234* (2013.01); *H01L 51/5056* (2013.01); *H01L 51/5088* (2013.01); *H01L 2251/5376* (2013.01)

(56) References Cited

U.S. PATENT DOCUMENTS

| | | | |
|---|---|---|---|
| 6,847,163 B1* | 1/2005 | Tsutsui | H01L 27/3244 313/484 |
| 7,009,338 B2 | 3/2006 | D'Andrade et al. | |
| 7,030,553 B2* | 4/2006 | Winters | H01L 27/3213 313/113 |
| 7,271,537 B2 | 9/2007 | Matsuda et al. | |
| 7,317,282 B2 | 1/2008 | Tsutsui et al. | |
| 7,462,883 B2 | 12/2008 | Kumaki et al. | |
| 7,548,019 B2 | 6/2009 | Omura et al. | |
| 7,554,265 B2 | 6/2009 | Godo et al. | |
| 7,560,862 B2 | 7/2009 | Liao et al. | |
| 7,564,052 B2 | 7/2009 | Kumaki | |
| 7,601,988 B2 | 10/2009 | Seo et al. | |
| 7,663,140 B2 | 2/2010 | Yamazaki et al. | |
| 7,737,626 B2 | 6/2010 | Kumaki et al. | |
| 7,753,751 B2 | 7/2010 | Yamazaki | |
| 7,851,989 B2 | 12/2010 | Noda | |
| 7,875,893 B2 | 1/2011 | Seo et al. | |
| 7,893,427 B2 | 2/2011 | Kumaki et al. | |
| 7,964,891 B2 | 6/2011 | Kumaki et al. | |
| 7,973,319 B2* | 7/2011 | Kashiwabara | H01L 27/3211 257/40 |
| 8,008,652 B2 | 8/2011 | Kumaki et al. | |
| 8,080,934 B2 | 12/2011 | Kido et al. | |
| 8,188,491 B2* | 5/2012 | Seo | H01L 51/5088 257/101 |
| 8,362,688 B2* | 1/2013 | Noda | H01L 51/5203 313/113 |
| 8,476,821 B2* | 7/2013 | Asano | G09G 3/3233 313/503 |
| 8,729,795 B2* | 5/2014 | Nomura | H01L 51/5265 257/40 |
| 2003/0189401 A1 | 10/2003 | Kido et al. | |
| 2005/0084712 A1 | 4/2005 | Kido et al. | |
| 2005/0098207 A1 | 5/2005 | Matsumoto et al. | |
| 2005/0218799 A1 | 10/2005 | Hamada | |
| 2005/0225232 A1 | 10/2005 | Boroson et al. | |
| 2005/0248267 A1 | 11/2005 | Gyoutoku et al. | |
| 2006/0163597 A1 | 7/2006 | Noda et al. | |
| 2006/0267483 A1 | 11/2006 | Tsutsui et al. | |
| 2006/0284204 A1 | 12/2006 | Yamazaki et al. | |
| 2007/0001570 A1 | 1/2007 | Nomura et al. | |
| 2007/0085075 A1 | 4/2007 | Yamazaki et al. | |
| 2007/0102737 A1 | 5/2007 | Kashiwabara et al. | |
| 2007/0176161 A1* | 8/2007 | Seo | H01L 51/5218 257/13 |
| 2008/0006821 A1 | 1/2008 | Suzuki et al. | |
| 2008/0241586 A1 | 10/2008 | Kumaki et al. | |
| 2009/0275161 A1 | 11/2009 | Kumaki et al. | |
| 2010/0176720 A1 | 7/2010 | Yamazaki | |
| 2011/0062475 A1 | 3/2011 | Cho | |
| 2011/0073885 A1 | 3/2011 | Kim et al. | |
| 2011/0101345 A1 | 5/2011 | Kumaki et al. | |
| 2011/0101380 A1 | 5/2011 | Kumaki et al. | |
| 2011/0108864 A1 | 5/2011 | Seo et al. | |
| 2011/0140101 A1 | 6/2011 | Noda | |
| 2011/0180794 A1 | 7/2011 | Yamazaki | |
| 2011/0187259 A1 | 8/2011 | Fukuda et al. | |
| 2011/0187260 A1 | 8/2011 | Fukuda et al. | |
| 2011/0241007 A1 | 10/2011 | Kumaki et al. | |
| 2011/0278562 A1 | 11/2011 | Kumaki et al. | |
| 2011/0291088 A1 | 12/2011 | Seo et al. | |
| 2011/0309351 A1 | 12/2011 | Kumaki et al. | |
| 2012/0126272 A1 | 5/2012 | Kurata et al. | |
| 2012/0181921 A1 | 7/2012 | Ono | |
| 2012/0205632 A1 | 8/2012 | Shitagaki et al. | |
| 2012/0205676 A1* | 8/2012 | Seo | H01L 51/504 257/88 |
| 2012/0205685 A1 | 8/2012 | Seo et al. | |
| 2012/0205686 A1* | 8/2012 | Seo | H01L 27/3209 257/89 |
| 2012/0205701 A1 | 8/2012 | Sasaki et al. | |
| 2012/0206675 A1* | 8/2012 | Seo | H01L 27/3211 349/96 |
| 2012/0242219 A1 | 9/2012 | Seo et al. | |
| 2012/0256208 A1* | 10/2012 | Hatano | H01L 51/504 257/89 |
| 2014/0077185 A1* | 3/2014 | Lee | H01L 51/5275 257/40 |
| 2014/0339522 A1 | 11/2014 | Nonaka et al. | |
| 2014/0346538 A1* | 11/2014 | Seo | G09G 3/3233 257/89 |
| 2015/0053958 A1 | 2/2015 | Ishisone et al. | |
| 2016/0133878 A1* | 5/2016 | Uesaka | H01L 27/1225 257/40 |

FOREIGN PATENT DOCUMENTS

| | | |
|---|---|---|
| JP | 2005-093401 A | 4/2005 |
| JP | 2006-012793 A | 1/2006 |
| JP | 2006-032327 A | 2/2006 |
| JP | 2006-126817 A | 5/2006 |
| JP | 2007-503093 | 2/2007 |
| JP | 2008-518400 | 5/2008 |
| JP | 2009-266459 A | 11/2009 |
| JP | 2009-266524 A | 11/2009 |
| JP | 2010-003577 A | 1/2010 |

OTHER PUBLICATIONS

Matsumoto.T et al., "27.5L: Late-News Paper: Multiphoton Organic EL Device Having Charge Generation Layer", SID Digest '03 : SID International Symposium of Technical Papers, 2003, vol. 34, pp. 979-981.

* cited by examiner

LIGHT-EMITTING DEVICE

CROSS-REFERENCE TO RELATED APPLICATIONS

This application is a continuation of U.S. application Ser. No. 14/820,814, filed Aug. 7, 2015, now allowed, which claims the benefit of a foreign priority application filed in Japan as Serial No. 2014-162549 on Aug. 8, 2014, both of which are incorporated by reference.

BACKGROUND OF THE INVENTION

1. Field of the Invention

One embodiment of the present invention relates to a light-emitting element, a light-emitting device, a lighting device, a display device, a display panel, and an electronic appliance.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

Light-emitting elements utilizing electroluminescence have been currently under active research and development. In a basic structure of the light-emitting element utilizing electroluminescence, a layer containing a light-emitting substance (hereinafter the layer is referred to as a "light-emitting layer") is interposed between a pair of electrodes. By voltage application between the pair of electrodes of the light-emitting element, light can be emitted from the light-emitting substance.

Among light-emitting elements utilizing electroluminescence (EL), particularly a light-emitting element in which an organic compound is used as a light-emitting substance can be formed by stacking thin films. Because the light-emitting element can thus be reduced in thickness and weight and can have a larger area easily, it is expected to be used for a planar light source. Furthermore, the light-emitting element is expected to have emission efficiency exceeding that of an incandescent lamp or a fluorescent lamp, and thus has attracted attention as a light-emitting element suitable for lighting equipment.

Furthermore, the above light-emitting element is also expected to be used for a display panel. To obtain a display panel capable of color display (not monochrome display), there is a method in which each pixel is provided with a plurality of subpixels of different colors and the intensity of light from each subpixel is adjusted to determine the color of the pixel.

In the case where the light-emitting element utilizing electroluminescence (EL) is used for a display panel, there are the following two methods: a method of providing subpixels in a pixel with EL layers each having a function of emitting light of a different color (hereinafter referred to as a separate coloring method) and a method of providing subpixels in a pixel with, for example, a common EL layer having a function of emitting white light and color filters each having a function of transmitting light of a different color (hereinafter referred to as a white EL+color filter method, and it is noted that the color of the common EL layer is not limited to white).

One of the advantages of the white EL+color filter method is that the EL layer can be shared by all of the subpixels. Therefore, compared with the separate coloring method, loss of a material of the EL layer is small and no cost for patterning is incurred; thus, display panels can be manufactured at low cost with high productivity. In the separate coloring method, it is necessary to provide a space between the subpixels to prevent mixture of the materials of the EL layers in the subpixels. However, in the white EL+color filter method, there is another advantage that the space is not necessary and therefore a high-resolution panel having higher pixel density can be achieved.

The light-emitting element can emit light of a variety of colors depending on the kind of light-emitting substance included in the EL layer. A light-emitting element which can emit white light or light of color close to white with high efficiency has been particularly required to be applied to a lighting and a display utilizing the white EL+color filter method.

As a light-emitting element which can emit white light, for example, a white light-emitting element in which a plurality of EL layers having emission peaks in the red, green, and blue wavelength ranges are stacked has been proposed (e.g., Patent Document 1). In addition, a white light-emitting element in which two EL layers having emission peaks in the wavelength ranges of complementary colors (e.g., blue and yellow) are stacked has been proposed (e.g., Patent Document 2). Note that such a structure in which a plurality of EL layers are stacked may be called a tandem structure.

REFERENCE

Patent Document

[Patent Document 1] Japanese Translation of PCT International Application No. 2008-518400
[Patent Document 2] Japanese Published Patent Application No. 2006-12793

SUMMARY OF THE INVENTION

The following structure can be employed in the case where a tandem light-emitting element is used as a white light-emitting element.

The tandem light-emitting element includes, between an anode and a cathode, a plurality of EL layers with an intermediate layer interposed therebetween. Light emitted from the plurality of EL layers can be collectively extracted, and accordingly current efficiency can be made higher than in a light-emitting element including a single EL layer.

In manufacture of a tandem light-emitting element, first, a first electrode (e.g., an anode) is formed over a substrate, and a hole-injection layer, a hole-transport layer, a light-emitting layer, and an electron-transport layer of a first EL layer are formed over the first electrode. An intermediate layer is next formed over the electron-transport layer of the first EL layer. Next, a hole-transport layer, a light-emitting layer, an electron-transport layer, and an electron-injection layer of a second EL layer are formed over the intermediate layer, and a second electrode (e.g., a cathode) is formed over the second EL layer. Thus, the tandem light-emitting element in which the two EL layers are stacked can be formed.

However, the tandem light-emitting element thus has a large number of stacked layers and therefore the number of manufacturing steps is increased. Accordingly, manufacturing the tandem light-emitting element in which a plurality of EL layers are stacked is costly not only because it takes much time to manufacture the light-emitting element but also because the manufacturing yield decreases.

In the case where the tandem light-emitting element is used as a white light-emitting element, a layer in which fluorescence is used as light with a short wavelength (fluorescent light-emitting layer) and a layer in which phosphorescence is used as light with a long wavelength (phosphorescent light-emitting layer) are provided in one EL layer.

The fluorescent light-emitting layer includes a material which converts a singlet excited state into light emission (a fluorescent light-emitting material), and the phosphorescent light-emitting layer includes a material which converts a triplet excited state into light emission (a phosphorescent light-emitting material). As for the fluorescent light-emitting material, light emission from the triplet excited state (phosphorescence) is not observed but only light emission from the singlet excited state (fluorescence) is observed at room temperature. Therefore, the internal quantum efficiency (the ratio of generated photons to injected carriers) of a light-emitting element using the fluorescent light-emitting material is assumed to have a theoretical limit of 25% based on the ratio of $S^*$ to $T^*$ which is 1:3. In contrast, in the phosphorescent light-emitting material, light emission from the triplet excited state (phosphorescence) is observed. Further, since intersystem crossing (i.e., transfer from a singlet excited state to a triplet excited state) easily occurs in the phosphorescent light-emitting material, the internal quantum efficiency can be increased to 100% in theory. That is, higher emission efficiency can be achieved than in the case of using a fluorescent light-emitting material. Therefore, it is preferable to use the phosphorescent light-emitting layer to achieve high emission efficiency. However, the phosphorescent light-emitting layer has a problem in the lifetime compared with the fluorescent light-emitting layer. Therefore, fluorescence is used as light with a short wavelength and a problem in the lifetime and phosphorescence is used as light with a long wavelength, whereby a white light-emitting element with stable characteristics can be obtained though it has lower efficiency than an element in which phosphorescence is used as light with both short and long wavelengths.

However, in the case where this EL element is used for a display panel, the fluorescent light-emitting layer that emits light with a short wavelength has low emission efficiency in a subpixel from which the light with a short wavelength is extracted; therefore, the intensity of the light with a short wavelength needs to be adjusted to that of light emitted from a subpixel from which light with a long wavelength is extracted. Therefore, high power consumption is essential to secure the intensity of the light with a short wavelength and accordingly overall power consumption of the display increases.

Furthermore, it is necessary to consider a region of the EL layer in which injected electrons and holes are recombined to examine performance of the EL element. This is because, if the region has no light-emitting layer, a light-emitting organic compound is not excited and does not emit light. In an EL layer having a light-emitting layer, the intensity of light that the light-emitting layer emits depends on the distribution of a region in which electrons and holes are recombined. In contrast, in an EL layer having a plurality of light-emitting layers, the intensity of light that each light-emitting layer emits depends on distribution of regions in which electrons and holes are recombined; therefore, the shapes of spectra of light that elements emit (the relative intensity ratio of wavelength components) also vary.

For example, when an EL layer having a plurality of light-emitting layers is formed under certain conditions, and a region of the EL layer in which injected electrons and holes are recombined is distributed at a high density in a first light-emitting layer but sparsely in a second light-emitting layer, the intensity of light that the first light-emitting layer emits is high, whereas that of light that the second light-emitting layer emits is weak. In a display manufactured using a color filter and an EL element including the EL layer, in a pixel, a first subpixel is provided with a color filter having a high light-transmitting property with respect to light in a wavelength range of light that the first light-emitting layer emits, and a second subpixel is provided with a color filter having a high light-transmitting property with respect to light in a wavelength range of light that the second light-emitting layer emits. In such a case, it is not easy to extract light with predetermined intensity from the second subpixel and high voltage is involved, though light with predetermined intensity can be extracted easily from the first subpixel. Thus, the display consumes much power, leading to a problem.

In view of the above problem, an object of one embodiment of the present invention is to provide a novel EL element. In addition, another object is to provide a novel structure of an EL element including an EL layer having a plurality of light-emitting layers. Another object of one embodiment of the present invention is to provide a light-emitting element where a region of an EL layer in which electrons and holes are recombined is adjusted. Another object of one embodiment of the present invention is to provide an EL element where regions of a plurality of EL layers in which electrons and holes are recombined are different from each other. Another object of one embodiment of the present invention is to provide an EL element having low power consumption and high emission efficiency. Another object of one embodiment of the present invention is to provide a high-resolution display panel. Another object of one embodiment of the present invention is to provide a light-emitting element, a lighting device, a display, and an electronic appliance each using a novel EL element. Another object of one embodiment of the present invention is to provide a light-emitting element.

Note that the description of these objects does not disturb the existence of other objects. In one embodiment of the present invention, there is no need to achieve all the objects. Other objects are apparent from and can be derived from the description of the specification, the drawings, the claims, and the like.

According to a structure of one embodiment of the present invention disclosed in this specification, a light-emitting device includes a first light-emitting element and a second light-emitting element. The first light-emitting element includes a first electrode, an EL layer, and a second electrode. The second light-emitting element includes a third electrode, the EL layer, and the second electrode. In the first light-emitting element, the EL layer is between the first electrode and the second electrode. In the second light-emitting element, the EL layer is between the third electrode and the second electrode. The EL layer includes a first light-emitting layer, a second light-emitting layer, and a layer. The first light-emitting layer is in contact with the layer. The layer is in contact with the second light-emitting layer. The structure of the first light-emitting layer is different from the structure of the second light-emitting layer. The first light-emitting element and the second light-emitting element are different in a carrier-injection property.

According to another structure of one embodiment of the present invention disclosed in this specification, a light-emitting device includes a first light-emitting element and a second light-emitting element. The first light-emitting element includes a first electrode, an EL layer, and a second electrode that are stacked in this order. The second light-emitting element includes a third electrode, the EL layer, and the second electrode that are stacked in this order. In the first light-emitting element, the EL layer is between the first electrode and the second electrode. In the second light-emitting element, the EL layer is between the third electrode and the second electrode. The EL layer includes a first light-emitting layer, a layer which is over and in contact with the first light-emitting layer, and a second light-emitting layer which is over and in contact with the layer. The first light-emitting layer includes a first substance. The second light-emitting layer includes a second substance. The first substance is different from the second substance. The first light-emitting element and the second light-emitting element are different in a carrier-injection property.

According to another structure of one embodiment of the present invention disclosed in this specification, a light-emitting device includes a first light-emitting element and a second light-emitting element. The first light-emitting element includes a first electrode, an EL layer which is over and in contact with the first electrode, and a second electrode which is over and in contact with the EL layer. The second light-emitting element includes the EL layer, a third electrode which is below and in contact with the EL layer, and the second electrode which is over and in contact with the EL layer. The EL layer includes a first light-emitting layer, a layer which is over and in contact with the first light-emitting layer, and a second light-emitting layer which is over and in contact with the layer. The first light-emitting layer includes a first substance. The second light-emitting layer includes a second substance. The first substance is different from the second substance. The first light-emitting element and the second light-emitting element are different in a carrier-injection property.

The light-emitting device of one embodiment of the present invention disclosed in this specification may be a light-emitting device in which one of the first substance and the second substance is capable of converting singlet-excitation energy into light emission, and the other is capable of converting triplet-excitation energy into light emission.

The light-emitting device of one embodiment of the present invention disclosed in this specification may be a light-emitting device in which, from the first light-emitting element, light whose color is different from a color of light which can be emitted from the second light-emitting element can be emitted. The light-emitting device of one embodiment of the present invention disclosed in this specification may be a light-emitting device in which the first substance is a substance having a function of emitting light having intensity in a blue wavelength range.

The light-emitting device of one embodiment of the present invention disclosed in this specification may be a light-emitting device in which the first light-emitting element further includes a first color filter, the second light-emitting element further includes a second color filter, and the first color filter is capable of transmitting light whose color is different from a color of light that the second color filter can transmit.

The light-emitting device of one embodiment of the present invention disclosed in this specification may be a light-emitting device in which the EL layer further includes a layer containing an acceptor substance below the first light-emitting layer. The light-emitting device of one embodiment of the present invention disclosed in this specification may be a light-emitting device in which a work function of the first electrode is different from a work function of the third electrode. The light-emitting device of one embodiment of the present invention disclosed in this specification may be a light-emitting device in which the first electrode is ITSO and the third electrode is Ti.

The light-emitting device of one embodiment of the present invention disclosed in this specification may be a light-emitting device in which the first electrode is electrically connected to a first transistor, and the third electrode is electrically connected to a second transistor.

In addition, the light-emitting element of one embodiment of the present invention disclosed in this specification may be a light-emitting element in which the second electrode and the fourth electrode each have the same structure. Alternatively, the light-emitting element of one embodiment of the present invention disclosed in this specification may be a light-emitting element in which the second electrode and the fourth electrode are formed through the same step.

A display panel may include the light-emitting device of one embodiment of the present invention disclosed in this specification and a driver circuit. A lighting device may include the light-emitting device of one embodiment of the present invention disclosed in this specification and a power switch. An electronic appliance may include the light-emitting device of one embodiment of the present invention disclosed in this specification and an operation button.

When the EL layer has one light-emitting layer, the shape of a spectrum of light that is emitted (the relative intensity ratio of wavelength components) is not affected by the distribution of a region in which carriers are recombined. However, when the EL layer includes a plurality of light-emitting layers, the intensity of light that the light-emitting layers emit depends on the distribution of regions in which the injected carriers are recombined. Therefore, the shapes of spectra of light extracted from the EL layer (the relative intensity ratio of wavelength components) are also affected and thus emission color is changed.

However, the carrier-injection property of the electrode in contact with the EL layer is one of the factors that determine a region in which carriers are recombined. That is, the distribution of a region in which electrons and holes are recombined is affected by an electron-injection property of the cathode in contact with the EL layer and a hole-injection property of the anode in contact with the EL layer in the light-emitting element. Here, the work functions of the cathode and the anode are one of the factors that determine the electron-injection property of the cathode and the hole-injection property of the anode. In some cases, the conductivity of the cathode and the anode is one of the factors that determine these injection properties.

Therefore, the distribution of the region in which carriers are recombined can be controlled by selecting materials of the anode and the cathode appropriately. Here, when light of a different color is attempted to be extracted from each of the first light-emitting element and the second light-emitting element of the light-emitting device, the case will be examined where long-wavelength light is extracted from a first subpixel and short-wavelength light is extracted from a second subpixel in a certain pixel in, for example, a display panel in which a fluorescent light-emitting material that emits light in a short wavelength region is used for the first light-emitting layer of the EL layer and a phosphorescent light-emitting material that emits light in a long wavelength region is used for the second light-emitting layer over the first light-emitting layer.

When a material having a low carrier-injection property is used for the electrode below the EL layer, a region in which carriers are recombined can be distributed at a high density on the first light-emitting layer side; therefore, emission intensity of light in a short-wavelength range that the first light-emitting layer emits can be made relatively high. Accordingly, light whose color is attempted to be extracted from the second subpixel can be extracted with low power. In contrast, light whose color is attempted to be extracted from the first subpixel is distributed at a low density in the second light-emitting layer; therefore, the light is extracted with high power.

Thus, in one embodiment of the present invention, the electrode used in the first subpixel and the electrode used in the second subpixel may each have a different structure, and regions in which carriers are recombined are distributed differently in the EL layers by a difference in a carrier-injection property between the electrodes. Accordingly, in the first subpixel, the region in which carriers are recombined is distributed at a high density on the second light-emitting layer side and the emission intensity of light in a long-wavelength range that the second light-emitting layer emits can be made relatively high, whereas in the second subpixel, the region in which carriers are recombined is distributed at a high density on the first light-emitting layer side and the emission intensity of light in a short-wavelength range that the first light-emitting layer emits can be made relatively high.

According to one embodiment of the present invention, owing to an advantage of a white EL+ color filter method in which EL layers of light-emitting elements are the same in all regions, predetermined light can be extracted from each subpixel with low power while high productivity of the light-emitting element is maintained. Therefore, power consumption of the light-emitting element can be reduced. Thus, a light-emitting element having high emission efficiency can be obtained. Moreover, extraction of the predetermined light from each subpixel enables a structure in which a color filter is not used.

Costs of the materials and patterning for the electrodes are lower than costs of an organic compound and patterning for the EL layer; therefore, a light-emitting element can be manufactured inexpensively. Furthermore, patterning of the materials for the electrodes can be performed more finely than patterning of the organic compound for the EL layer, and it is not necessary to provide a space between subpixels to prevent mixture of materials of the EL layers in the subpixels as in a separate coloring method. Accordingly, a high-resolution display panel can be obtained.

According to one embodiment of the present invention, a novel EL element can be provided. In addition, a novel structure of an EL element including an EL layer having a plurality of light-emitting layers can be provided. According to one embodiment of the present invention, a light-emitting element where a region of an EL layer in which electrons and holes are recombined is adjusted can be provided. According to one embodiment of the present invention, an EL element where regions of a plurality of EL layers in which electrons and holes are recombined are different from each other can be provided. According to one embodiment of the present invention, an EL element having low power consumption and high emission efficiency can be provided.

According to one embodiment of the present invention, a high-resolution display panel can be provided. According to one embodiment of the present invention, a light-emitting element, a lighting device, a display, and an electronic appliance each using a novel EL element can be provided. According to one embodiment of the present invention, a light-emitting element can be provided.

Note that the description of these effects does not disturb the existence of other effects. In one embodiment of the present invention, there is no need to obtain all the above effects. Other effects are apparent from and can be derived from the description of the specification, the drawings, the claims, and the like.

DETAILED DESCRIPTION OF THE INVENTION

Figure 1A:
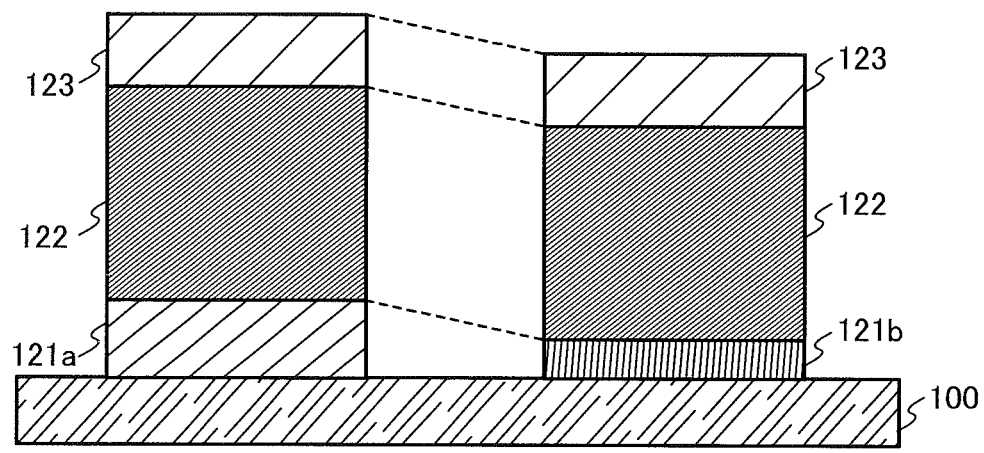
FIGS. 1A and 1B illustrate cross-sectional structures of a light-emitting element.

Embodiments of one embodiment of the present invention will be described below. However, the present invention can be implemented in various modes, and it is easily understood by those skilled in the art that modes and details disclosed herein can be modified in various ways without departing from the spirit and the scope of one embodiment of the present invention. Therefore, the present invention is not construed as being limited to description of the embodiments.

Note that in each drawing described in this specification, the size, the thickness, and the like of each component such as an anode, an EL layer, an intermediate layer, and a cathode is exaggerated for clarity in some cases. Therefore, the sizes of the components are not limited to the sizes in the drawings and relative sizes between the components.

Ordinal numbers such as "first", "second", and "third" are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that in the structures of one embodiment of the present invention described in this specification and the like, the same portions or portions having similar functions in different drawings are denoted by the same reference numerals, and description of such portions is not repeated. Furthermore, the same hatching pattern is applied to portions having similar functions, and the portions are not especially denoted by reference numerals in some cases.

In general, color is defined by three aspects of hue (corresponding to the wavelength of light of a single color), chroma (saturation, i.e., the degree to which it differs from white), and value (brightness, i.e., the intensity of light). In this specification, color may be defined by only one of the above three aspects or two of the aspects which are selected arbitrarily. In this specification, a difference between two colors of light means a difference in at least one of the above three aspects and includes a difference in the shapes of two spectra of light or in the distributions of the relative intensity of the peaks in the spectra.

In this specification and the like, blue light has at least one peak of emission spectrum in a wavelength range of 420 nm or more and 480 nm or less, green light has at least one peak of emission spectrum in a wavelength range of 500 nm or more and less than 550 nm, yellow light has at least one peak of emission spectrum in a wavelength range of 550 nm or more and 590 nm or less, and red light has at least one peak of emission spectrum in a wavelength range of 600 nm or more and 740 nm or less.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. In this specification and the like, the structure of a layer is different (the structure of an electrode is different) means that, when a layer (electrode) includes plural substances, at least one of the substances is different from another layer (electrode). Furthermore, it also means that, even when plural substances included in a layer (electrode) are the same as those in another layer (electrode), the ratio of the substances is different. The structure of a layer is different also means that a layer (electrode) includes a certain substance but another layer (electrode) does not include it.

In this specification and the like, a fluorescent light-emitting material refers to a material that emits light in the visible light region when the level of the lowest singlet excited state ($S_1$ level) relaxes to the ground state. A phosphorescent light-emitting material refers to a material that emits light in the visible light region at room temperature when the level of the lowest triplet excited state ($T_1$ level) relaxes to the ground state. That is, a phosphorescent light-emitting material refers to a material that can convert triplet excitation energy into visible light.

Embodiment 1

In this embodiment, a structure of a light-emitting element of one embodiment of the present invention will be described with reference to FIGS. 1A and 1B.

FIG. 1A illustrates an EL element including an EL layer 122 between a cathode 123, and an anode 121a or an anode 121b. Although the number of EL layers is one in this embodiment, a tandem structure in which two or more EL layers are stacked and an intermediate layer is provided between the two EL layers may be employed. The anode 121a is formed over a substrate 100 in a first region, and the anode 121b is formed over the substrate 100 in a second region. Next, the EL layer 122 is formed over the anode 121a and the anode 121b, and the cathode 123 is formed over the EL layer 122. That is, in the light-emitting element of one embodiment of the present invention, each EL layer is in contact with one of two or more kinds of anodes.

Figure 1B:
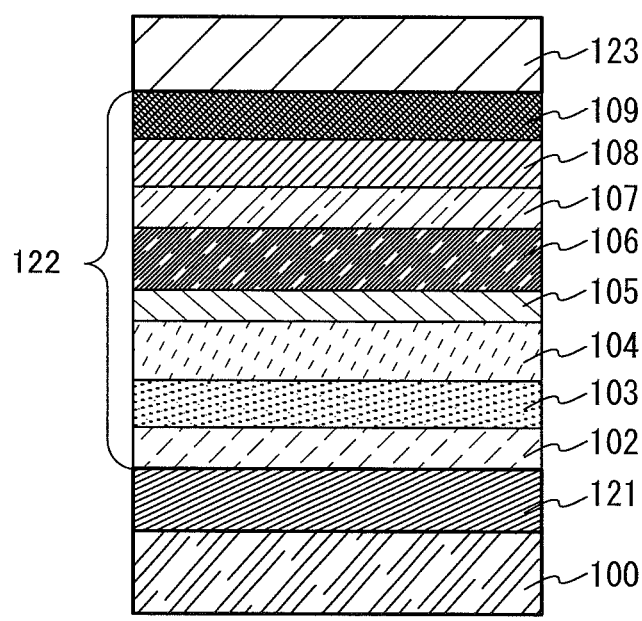

FIG. 1B illustrates a structure of the light-emitting element of one embodiment of the present invention that includes one EL layer 122 and electrodes over and under the EL layer 122. An anode 121 is formed over the substrate 100, and a hole-injection layer 102 and a hole-transport layer 103 are formed over the anode 121. Then, a first light-emitting layer 104, a layer 105, a second light-emitting layer 106, and a third light-emitting layer 107 are formed over the hole-transport layer 103. An electron-transport layer 108, an electron-injection layer 109, and the cathode 123 are formed in this order over the third light-emitting layer 107 to form a light-emitting element. Note that at least two light-emitting layers are provided and the third light-emitting layer is not necessarily provided. A field effect transistor (FET) may be formed between the substrate 100 and the anode 121, and a signal supplied from the field effect transistor (FET) is input to the anode 121. That is, the stacked-layer structure in FIGS. 1A and 1B is an example, and the light-emitting element of one embodiment of the present invention is not limited thereto.

Note that the layers between the anode 121 and the cathode 123 may be stacked in the reverse order. In other words, the cathode, the electron-injection layer, the electron-transport layer, the first light-emitting layer, the second light-emitting layer, the hole-transport layer, the hole-injection layer, and the anode may be stacked in this order over the substrate. Although the first light-emitting layer contains a fluorescent light-emitting material and the second and third light-emitting layers each contain a phosphorescent light-emitting material in this embodiment, one embodiment of the present invention is not limited to the structures. Although the layer is provided between the first light-emitting layer and the second light-emitting layer, the layer is not necessarily provided and another layer may be provided between the second light-emitting layer and the third light-emitting layer. Each of the layers that form the EL layer 122 may be integrated with its upper or lower layer, depending on its function.

<<Structure of Substrate>>

First, the substrate 100 is described.

Note that in this specification and the like, a transistor and a light-emitting element can be formed using any of a variety of substrates. The type of a substrate is not limited to a particular type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, and the like. Examples of the glass substrate are a barium borosilicate glass substrate, an aluminoborosilicate glass substrate, a soda lime glass substrate, and the like. Examples of the flexible substrate, the attachment film, the base film, and the like are substrates of plastics typified by polyethylene terephthalate (PET), polyethylene naphthalate (PEN), and polyether sulfone (PES). Other examples are substrates of synthetic resins such as acrylic. Other examples are polypropylene, polyester, polyvinyl fluoride, polyvinyl chloride, and the like. Other examples are polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. Forming a circuit with the use of such transistors leads to a reduction in power consumption of the circuit or high integration of the circuit.

Alternatively, a flexible substrate may be used as the substrate such that the transistor and the light-emitting element may be provided directly on the flexible substrate. Still alternatively, a separation layer may be provided between the substrate and the transistor and between the substrate and the light-emitting element. The separation layer can be used when part or the whole of a semiconductor device formed over the separation layer is separated from the substrate and transferred onto another substrate. In such a case, the transistor and the light-emitting element can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, after the transistor and the light-emitting element are formed using a substrate, the transistor and the light-emitting element may be transferred to another substrate. Example of the substrate to which the transistor and the light-emitting element are transferred are, in addition to the above substrate over which the transistor and the light-emitting element can be formed, a paper substrate, a cellophane substrate, an aramid film substrate, a polyimide film substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, a rubber substrate, and the like. The use of such a substrate enables formation of a transistor with excellent properties, a transistor with low power consumption, or a device with high durability, high heat resistance, or a reduction in weight or thickness.

<<Structure of Anode>>

Next, the anode 121 is described.

In the light-emitting element of one embodiment of the present invention, two or more kinds of anodes 121 of different materials are formed over the substrate 100. That is, the anode 121a is formed in the first region, and the anode 121b is formed in the second region. Since the materials of the anode 121a and the anode 121b are different, carrier (hole)-injection properties to the EL layer 122 are different between the anodes.

It is preferable to use materials having a high work function for the anodes. In the EL layer 122 in contact with the anode having a relatively high work function and a high hole-injection property among them, a region in which holes injected from the anode and electrons injected from the cathode are recombined is distributed relatively on the cathode side at a high density. In contrast, in the EL layer 122 in contact with the anode having a relatively low work function and a low hole-injection property, a region in which holes and electrons are recombined is distributed relatively on the anode side at a high density.

Meanwhile, when there is a light-emitting layer in a region in which carriers are recombined, light is emitted from the light-emitting layer. With one light-emitting layer, emission intensity and emission efficiency of a light-emitting element can be improved by determining materials and the thicknesses of the layers that form the light-emitting element so that the region in which carriers are recombined is distributed at a high density in the light-emitting layer. However, the shape of spectrum of light emitted from the light-emitting layer (the relative intensity ratio of wavelength components) is not affected; thus, emission color is not changed.

In contrast, in the case where the EL layer 122 includes two or more light-emitting layers, the ratio between the intensities of light emitted from the respective light-emitting layers is changed when the distribution of a region in which carriers are recombined is changed and the ratio between the density of a region in which carriers are recombined in one light-emitting layer and that in another light-emitting layer is changed. Therefore, in the case where light of a different color is emitted from each light-emitting layer, the shapes of spectra of light extracted from the whole light-emitting element (the relative intensity ratio of wavelength components) are changed, that is, the color of light emitted from the light-emitting element is changed.

Since the materials of the anode 121a in the first region and the anode 121b in the second region are different, carrier (hole)-injection properties to the EL layer 122 are different between the anodes. As will be described later, the EL layer of the light-emitting element of one embodiment of the present invention includes at least two light-emitting layers. Therefore, in the EL layer over the anode having a relatively high carrier (hole)-injection property, a region in which carriers are recombined is distributed at a high density in the light-emitting layer which is close to the cathode and a region in which carriers are recombined is distributed at a low density in the light-emitting layer which is close to the anode, whereas in the EL layer over the anode having a relatively low carrier (hole)-injection property, a region in which carriers are recombined is distributed at a low density in the light-emitting layer which is close to the cathode and a region in which carriers are recombined is distributed at a high density in the light-emitting layer which is close to the anode.

Therefore, in the light-emitting element of one embodiment of the present invention, the emission intensity and emission efficiency of the first light-emitting layer can be increased in the first region, and those of the second light-emitting layer can be increased in the second region.

For example, a display panel of one embodiment of the present invention in which the first region is used for a first subpixel and the second region is used for a second subpixel can be manufactured. Light that the first light-emitting layer emits is mainly extracted from the first subpixel and light that the second light-emitting layer emits is mainly extracted from the second subpixel, whereby light of a target color can be extracted with high emission efficiency from each subpixel and therefore, for example, a display panel having low power consumption can be obtained.

A material that can be used for the anode will be described. To function as the anode, it is preferably formed using any of metals, alloys, conductive compounds with a high work function (specifically, a work function of 4.0 eV or more), mixtures thereof, and the like. Specifically, for example, indium-tin oxide (ITO), indium-tin oxide containing silicon or silicon oxide (ITSO), indium-zinc oxide, indium oxide containing tungsten oxide and zinc oxide, and the like can be given. Such conductive metal oxide films are usually formed by a sputtering method, but may be formed by application of a sol-gel method or the like. In an example of the formation method, indium-zinc oxide is formed by a sputtering method using a target obtained by adding zinc oxide to indium oxide at 1 wt % to 20 wt %. A film of indium oxide containing tungsten oxide and zinc oxide can be formed by a sputtering method using a target obtained by adding tungsten oxide and zinc oxide at 0.5 wt % to 5 wt % and 0.1 wt % to 1 wt %, respectively, to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride thereof (e.g., titanium nitride), and the like can be given. Graphene can also be used.

Different materials are selected from the above materials for the anode in the first region and the anode in the second region. Materials different in a work function and a carrier injection property are used for the anodes, so that regions in which carriers are recombined are distributed in the EL layers differently in the first region and the second region.

When the anode is formed with a material having a light-transmitting property, the light-emitting element can have a bottom emission structure. When the anode is formed with a reflective material not having a light-transmitting property and the cathode has a light-transmitting property, the light-emitting element can have a top emission structure.

A structure of the EL layer 122 is next described.

<<Structure of EL Layer>>

In the light-emitting element of one embodiment of the present invention, the EL layer includes two or more light-emitting layers containing a light-emitting substance, and a hole-injection layer, a hole-transport layer, a first light-emitting layer, a second light-emitting layer, an electron-transport layer, and an electron-injection layer are stacked in this order from the anode side. Each layer is not necessarily a single layer and may be formed of two or more layers. One layer may serve as the electron-injection layer and the electron-transport layer, and one layer may serve as the hole-transport layer and the hole-injection layer. One or more layers other than the light-emitting layer may be omitted. Another layer may be provided between the first light-emitting layer and the second light-emitting layer.

Note that in one embodiment of the present invention, distribution of regions in which carriers are recombined in the EL layer is adjusted by materials of the anodes; therefore, the EL layer can have a uniform layer structure in the entire surface of the light-emitting element. Since the distribution is adjusted by anode materials in one embodiment of the present invention, it is not necessary to separately coat the EL layers in accordance with the regions; therefore, a step of forming the EL layers is not complicated, yield is not reduced, and thus high productivity can be maintained. Cost is not incurred to form plural kinds of EL layers and layout limitation by a space (margin) required in separate coating of the EL layers is not caused.

First, the hole-injection layer 102 is formed over the anode 121. The hole-injection layer 102 contains a substance having a high hole-injection property. As the substance having a high hole-injection property, for example, molybdenum oxide, vanadium oxide, ruthenium oxide, tungsten oxide, manganese oxide, or the like can be used. Alternatively, the hole-injection layer can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, for the hole-injection layer 102, a composite material in which a substance having a hole-transport property contains a substance having an acceptor property can be used. Note that the use of such a substance having a hole-transport property which contains a substance having an acceptor property enables selection of a material used to form an electrode regardless of its work function. In other words, besides a material having a high work function, a material having a low work function can be used for the hole-injection layer 102. As the substance having an acceptor property, 7,7,8,8-tetracyano-2,3,5,6-tetrafluoroquinodimethane (abbreviation: $F_4$-TCNQ), chloranil, or the like can be given. In addition, transition metal oxides can be given. Moreover, an oxide of the metals belonging to Groups 4 to 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, use of a substance having a hole mobility greater than or equal to $10^{-6}$ cm$^2$/Vs is preferable. Organic compounds that can be used as the substance having a hole-transport property in the composite material are specifically given below.

Examples of the material having a hole-transport property include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton, such as 4,4',4''-(benzene-1,3,5-triyl)tri (dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage. Hole-transport materials can be selected from a variety of substances as well as from the hole-transport materials given above.

By providing the hole-injection layer 102, a high hole-injection property can be achieved to allow the light-emitting element to be driven at a low voltage.

The hole-transport layer 103 is formed over the hole-injection layer 102. Examples of the substance having a high hole-transport property used for the hole-transport layer 103 include an aromatic amine compound such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), 3,3'-bis(9-phenyl-9H-carbazole) (abbreviation: PCCP), N-[4-(9H-carbazol-9-yl)phenyl]-N-(4-phenyl)phenylaniline (abbreviation: YGA1BP), 1,3,5-tri(dibenzothiophen-4-yl)-benzene (abbreviation: DBT3P-II), 4,4',4"-(benzene-1,3,5-triyl)tri(dibenzofuran) (abbreviation: DBF3P-II), 4-phenyl-4'-(9-phenylfluoren-9-yl)triphenylamine (abbreviation: BPAFLP), 4-[3-(triphenylen-2-yl)phenyl]dibenzothiophene (abbreviation: mDBTPTp-II), 4,4'-bis[N-(1-naphthyl)-N-phenylamino]biphenyl (abbreviation: NPB), N,N-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1; 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Other examples include carbazole compounds such as 4,4'-di(N-carbazolyl)biphenyl (abbreviation: CBP) and 1,3,5-tris[4-(N-carbazolyl)phenyl]benzene (abbreviation: TCPB); amine compounds; dibenzothiophene compounds; dibenzofuran compounds; fluorene compounds; triphenylene compounds; phenanthrene compounds; and the like.

The first light-emitting layer 104 and the second light-emitting layer 106 are formed over the hole-transport layer 103. Note that in one embodiment of the present invention, three or more light-emitting layers may be included or another layer may be interposed between the two light-emitting layers. In the light-emitting element of this embodiment, the layer 105 is provided between the first light-emitting layer 104 and the second light-emitting layer 106.

The first light-emitting layer 104 and the second light-emitting layer 106 each contain a light-emitting substance. Each light-emitting layer may contain only a light-emitting substance; alternatively, a light-emitting substance may be diffused in a host material. There is no particular limitation on materials that can be used as the light-emitting substance, and light emitted from these substances may be either fluorescence or phosphorescence.

Note that in the case where the light-emitting element of one embodiment of the present invention is used for a display panel, it is preferable that light extracted from the light-emitting element be white light having components in all visible light ranges to have full color display. Therefore, light whose colors have a complementary relationship between the first light-emitting layer and the second light-emitting layer is preferably emitted.

As described above, there are fluorescence and phosphorescence as light emission of EL and phosphorescence has high emission efficiency in principle; therefore, a material emitting phosphorescence is preferably used as a light-emitting substance of each light-emitting layer so that low power consumption of the light-emitting element can be achieved. However, a phosphorescent light-emitting material capable of stably emitting light in a certain part of the visible light range is still under development in some cases, and in such a case, a fluorescent light-emitting material is used. For example, a phosphorescent light-emitting material capable of emitting light having a peak in a wavelength range of red to green has been developed and mostly obtained, whereas a phosphorescent light-emitting material capable of emitting blue light is still under development.

In the light-emitting element of one embodiment of the present invention, a material that can emit blue fluorescence can be used for the first light-emitting layer, and a material that can emit yellow phosphorescence can be used for the second light-emitting layer. In this case, the emission efficiency of the first light-emitting layer using fluorescence is low in principle and thus high power consumption is involved.

Thus, when the first region of the light-emitting element is used as a subpixel for extracting blue light, a material whose work function is lower than that used for the anode in the second region is used for the anode in the first region so that a region in which carriers are recombined is distributed in the EL layer at a higher density in the first light-emitting layer. Accordingly, the region in which carriers are recombined can be distributed in the first light-emitting layer at a higher density; thus, the intensity of the blue light that the first light-emitting layer emits is increased, the emission efficiency of the blue light is increased, and power consumption can be reduced.

In contrast, the second region of the light-emitting element is used as a subpixel for extracting yellow light; therefore, a material whose work function is higher than that used for the anode in the first region is used for the anode in the second region and a region in which carriers are recombined is distributed at a higher density in the second light-emitting layer, whereby the intensity of the yellow light that the second light-emitting layer emits can be maintained high.

As described above, with the use of different materials for the anode in the first region and the anode in the second region, the intensities of light whose colors are desired to be extracted in both the first region and the second region are increased and therefore a light-emitting element having high emission efficiency can be obtained.

Note that although the first light-emitting layer contains a fluorescent light-emitting material and the second light-emitting layer contains a phosphorescent light-emitting material in this embodiment, the first light-emitting layer may contain a phosphorescent light-emitting material and the second light-emitting layer may contain a fluorescent light-emitting material.

Examples of the light-emitting substance are given below.

Examples of the substance emitting phosphorescence include bis{2-[3',5'-bis(trifluoromethyl)phenyl]pyridinato-$N,C^{2'}$}iridium(III) picolinate (abbreviation: Ir(CF$_3$ppy)$_2$(pic)), bis[2-(4',6'-difluorophenyl)pyridinato-$N,C^{2'}$]iridium(III) acetylacetonate (abbreviation: FIr(acac)), tris(2-phenylpyridinato)iridium(II) (abbreviation: Ir(ppy)$_3$), bis(2-phenylpyridinato)iridium(III) acetylacetonate (abbreviation: Ir(ppy)$_2$(acac)), tris(acetylacetonato) (monophenanthroline) terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-$N,C^{2'}$) iridium(III) acetylacetonate (abbreviation: Ir(dpo)$_2$(acac)), bis(2-[4'-(perfluorophenyl)phenyl]pyridinato-$N,C^{2'}$) iridium(III) acetylacetonate (abbreviation: Ir(p-PF-ph)$_2$(acac)), bis(2-phenylbenzothiazolato-$N,C^{2'}$)iridium(III) acetylacetonate (abbreviation: Ir(bt)$_2$(acac)), bis[2-(2'-benzo[4,5-a]thienyl)pyridinato-$N,C^{3'}$]iridium(III) acetylacetonate (abbreviation: Ir(btp)$_2$(acac)), bis(1-phenylisoquinolinato-$N,C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(3,5-dimethyl-2-phenylpyrazinato) iridium(III) (abbreviation: [Ir(mppr-Me)$_2$(acac)]), (acetylacetonato)bis(5-isopropyl-3-methyl-2-phenylpyrazinato) iridium(III) (abbreviation: [Ir(mppr-iPr)$_2$(acac)]), (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: [Ir(tppr)$_2$(dpm)]), (acetylacetonato)bis(6-tert-butyl-4-phenylpyrimidinato)iridium(III) (abbreviation: [Ir(tBuppm)$_2$(acac)]), (acetylacetonato)bis(4,6-diphenylpyrimidinato)iridium(I) (abbreviation: [Ir(dppm)$_2$(acac)]), 2,3,7,8,12,13,17,18-octaethyl-21H,23H-porphyrin platinum(II) (abbreviation: PtOEP), tris(1,3-diphenyl-1,3-propanedionato) (monophenanthroline)europium(III) (abbreviation: Eu(DBM)$_3$(Phen)), tris[1-(2-thenoyl)-3,3,3-trifluoroacetonato](monophenanthroline)europium(II) (abbreviation: Eu(TTA)$_3$(Phen)), and the like.

Although there is no particular limitation on a material that can be used as the host material described above, any of the following compounds can be used for the host material, for example: metal complexes such as tris(8-quinolinolato) aluminum(III) (abbreviation: Alq), tris(4-methyl-8-quinolinolato)aluminum(III) (abbreviation: Almq3), bis(10-hydroxybenzo[h]quinolinato)beryllium(II) (abbreviation: BeBq2), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB, TPD, and BSPB. In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl) phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbrevoatopm: 2PCAPA), 6,12-dimethoxy-5,11-diphenylchrysene, N,N,N'N',N'', N'',N''',N'''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl) benzene (abbreviation: TPB3), and the like. One or more substances having a wider energy gap than the light-emitting substance described above is preferably selected from these substances and a variety of substances. Moreover, in the case where the light-emitting substance emits phosphorescence, a substance having triplet excitation energy (energy difference between a ground state and a triplet excited state) which is higher than that of the light-emitting substance is preferably selected as the host material.

The layer 105 may be formed between the first light-emitting layer 104 and the second light-emitting layer 106. The layer 105 has a function of preventing unintentional movement of charges between the upper and lower light-emitting layers and a function of adjusting distribution of a region in which carriers are recombined. The material that can be used for the layer 105 is similar to the above material that can be used as the host material, for example. When a plurality of materials are used for the layer 105, the distribution of a region in which carriers are recombined can be adjusted by adjusting the ratio of the materials. For example, when the proportion of a material having a high electron-transport property in the layer 105 is increased, electrons easily pass through the layer 105; therefore, a region in which carriers are recombined is distributed on the anode side.

Next, the electron-transport layer 108 is formed over the light-emitting layer. The electron-transport layer 108 contains a substance having a high electron-transport property. For the electron-transport layer 108, a metal complex such as Alq, Almq$_3$, BeBq$_2$, BAlq, ZnPBO, or ZnBTZ can be used. Furthermore, a heteroaromatic compound such as PBD, OXD-7, TAZ, 3-(4-tert-butylphenyl)-4-(4-ethylphenyl)-5-(4-biphenylyl)-1,2,4-triazole (abbreviation: p-EtTAZ), BPhen, BCP, or 4,4'-bis(5-methylbenzoxazol-2-yl) stilbene (abbreviation: BzOs) can also be used. Furthermore, alternatively, it is possible to use a high molecular compound such as poly(2,5-pyridinediyl) (abbreviation: PPy), poly[(9,9-dihexylfluorene-2,7-diyl)-co-(pyridine-3,5-diyl)]

(abbreviation: PF-Py) or poly[(9,9-dioctylfluorene-2,7-diyl)-co-(2,2'-bipyridine-6,6'-diyl)](abbreviation: PF-BPy). The substances mentioned here are mainly ones that have an electron mobility of $10^{-6}$ cm$^2$/Vs or more. Note that any substance other than the above substances may be used for the electron-transport layer 108 as long as the electron-transport property is higher than the hole-transport property.

Furthermore, the electron-transport layer 108 is not limited to a single layer and may be a stack of two or more layers each containing the aforementioned substance.

The electron-injection layer 109 is formed over the electron-transport layer 108. The electron-injection layer 109 contains a substance having a high electron-injection property. For the electron-injection layer 109, an alkali metal, an alkaline earth metal, or a compound of the metal such as lithium fluoride (LiF), cesium fluoride (CsF), calcium fluoride (CaF$_2$), or lithium oxide (LiO$_x$) can be used. A rare earth metal compound such as erbium fluoride (ErF$_3$) can be used. Any of the above substances that can form the electron-transport layer can be used.

Alternatively, a composite material in which an organic compound and an electron donor (donor) are mixed may be used for the electron-injection layer 109. Such a composite material is excellent in an electron-injection property and an electron-transport property because electrons are generated in the organic compound by the electron donor. In this case, the organic compound is preferably a material that is excellent in transporting the generated electrons. Specifically, for example, the substances that can form the electron-transport layer, which are described above, can be used. As the electron donor, a substance showing an electron-donating property to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

In the above manner, the EL layer 122 of one embodiment of the present invention can be formed. As described above, the EL layer 122 of one embodiment of the present invention can be formed without coating the EL layer separately in accordance with the regions; therefore, loss of materials needed to manufacture a light-emitting element can be minimized. In addition, the light-emitting element can be manufactured with high yield because the manufacturing process is simple.

<<Structure of Cathode>>

Next, the cathode 123 is described. At least one of the cathode 123 and the anode 121 is formed using a conductive film which transmits visible light. For example, when one of the cathode 123 and the anode 121 is formed using a conductive film which transmits visible light and the other is formed using a conductive film which reflects visible light, a light-emitting element which emits light from one side can be formed. Alternatively, when both the cathode 123 and the anode 121 are formed using conductive films which transmit visible light, a light-emitting element which emits light from both sides can be formed. If the anode 121 is formed using a conductive film which does not transmit visible light, the cathode 123 needs to be formed using a conductive film which transmits visible light.

Examples of the conductive film that transmits visible light include a film of indium-tin oxide, a film of indium-tin oxide containing silicon or silicon oxide, a film of indium-tin oxide containing titanium, a film of indium-titanium oxide, a film of indium-tungsten oxide, a film of indium-zinc oxide, and a film of indium-zinc oxide containing tungsten. Furthermore, a metal thin film whose thickness is set so that light is transmitted (preferably, thickness approximately greater than or equal to 5 nm and less than or equal to 30 nm) can also be used.

For the conductive film which reflects visible light, a metal is used, for example. Specific examples thereof include metal materials such as silver, aluminum, platinum, gold, and copper, and an alloy material containing any of these. Examples of the alloy containing silver include a silver-neodymium alloy and a silver-palladium-copper alloy. Examples of the alloy of aluminum include an aluminum-nickel-lanthanum alloy, an aluminum-titanium alloy, and an aluminum-neodymium alloy.

The cathode is preferably formed using a metal having a low work function (e.g., an alkali metal or an alkaline earth metal) or an alloy containing such a metal. For example, in an organic light-emitting element in which an aluminum alloy containing a slight amount of lithium (Li), which is one of alkali metals, (an AlLi alloy) is used for a cathode, in general, emission characteristics are favorable and a drop of luminance is small even after long time. Alternatively, favorable element characteristics can be similarly obtained also in a structure in which a film of a single metal (e.g., Al) whose work function is not so low is stacked over an extremely thin film (approximately 1 nm) of an oxide or a fluoride of an alkali metal or an oxide or a fluoride of an alkaline earth metal. For example, as the cathode, similar characteristics can be obtained even with a structure in which, instead of an AlLi alloy film, an Al film is stacked over an extremely thin LiF film.

The light-emitting element of one embodiment of the present invention can be formed with the above stacked-layer structure.

In this embodiment, one embodiment of the present invention has been described. Other embodiments of the present invention are described in Embodiments 2 to 8. Note that one embodiment of the present invention is not limited to the above examples. Although an example in which the anode in the first region and the anode in the second region include different materials is shown as one embodiment of the present invention, one embodiment of the present invention is not limited thereto. For example, depending on the case or situation, the same materials may be used for both the anode in the first region and the anode in the second region in one embodiment of the present invention.

Note that the structure described in this embodiment can be combined as appropriate with any of the structures described in the other embodiments and the examples.

Embodiment 2

In this embodiment, a light emission mechanism of a light-emitting element that can be used for a light-emitting element of one embodiment of the present invention, a light-emitting device of one embodiment of the present invention, or a display device of one embodiment of the present invention will be described with reference to FIG. 3, FIGS. 4A and 4B, and FIG. 5.

Figure 3:
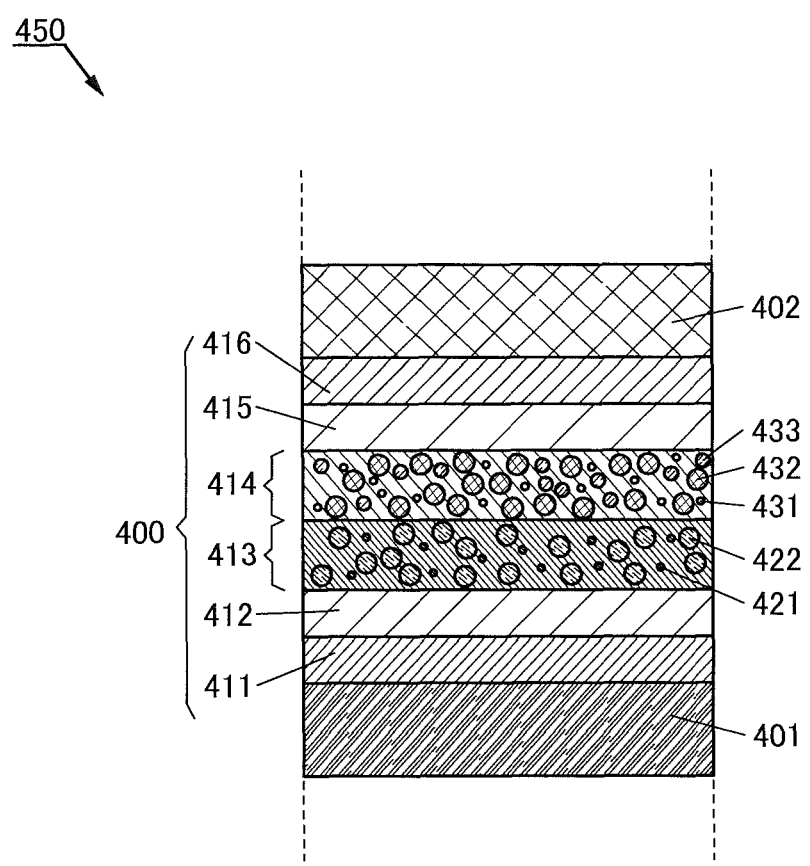
FIG. 3 is a schematic cross-sectional view illustrating a light-emitting element of one embodiment of the present invention.

FIG. 3 is a schematic cross-sectional view of a light-emitting element 450.

In the light-emitting element 450 in FIG. 3, an EL layer 400 is interposed between a pair of electrodes (a first electrode 401 and a second electrode 402). Note that in the light-emitting element 450, the first electrode 401 functions as an anode, and the second electrode 402 functions as a cathode.

The EL layer 400 includes a first light-emitting layer 413 and a second light-emitting layer 414. In the light-emitting element 450, as the EL layer 400, a hole-injection layer 411, a hole-transport layer 412, an electron-transport layer 415, and an electron-injection layer 416 are illustrated in addition to the first light-emitting layer 413 and the second light-emitting layer 414. However, this stacked-layer structure is an example, and the structure of the EL layer 400 in the light-emitting element 450 is not limited thereto. For example, the stacking order of the above layers of the EL layer 400 may be changed. Alternatively, in the EL layer 400, another functional layer other than the above layers may be provided. The functional layer may have a function of blocking a carrier (an electron or a hole), a function of transporting a carrier, a function of inhibiting a carrier, or a function of generating a carrier, for example.

The first light-emitting layer 413 includes a guest material 421 and a host material 422. The second light-emitting layer 414 includes a guest material 431, a first organic compound 432, and a second organic compound 433. Note that in the following description, the guest material 421 is a fluorescent light-emitting material and the guest material 431 is a phosphorescent light-emitting material.

<Light Emission Mechanism of First Light-Emitting Layer>

First, the light emission mechanism of the first light-emitting layer 413 is described below.

In the first light-emitting layer 413, recombination of carriers forms an excited state. Because the amount of the host material 422 is large as compared to the guest material 421, the excited states are formed mostly as the excited states of the host material 422. The ratio of singlet excited states to triplet excited states caused by carrier recombination (hereinafter referred to as exciton generation probability) is approximately 1:3.

First, a case where a $T_1$ level of the host material 422 is higher than a $T_1$ level of the guest material 421 is described below.

Energy is transferred from the host material 422 in the triplet excited state to the guest material 421 (triplet energy transfer). However, the triplet excited state of the guest material 421 does not offer emission of light in a visible light region because the guest material 421 is the fluorescent light-emitting material. Thus, the triplet excited state of the host material 422 cannot be used for light emission. Therefore, when the $T_1$ level of the host material 422 is higher than the $T_1$ level of the guest material 421, only approximately 25% of injected carriers can be used for light emission at most.

Figure 4A:
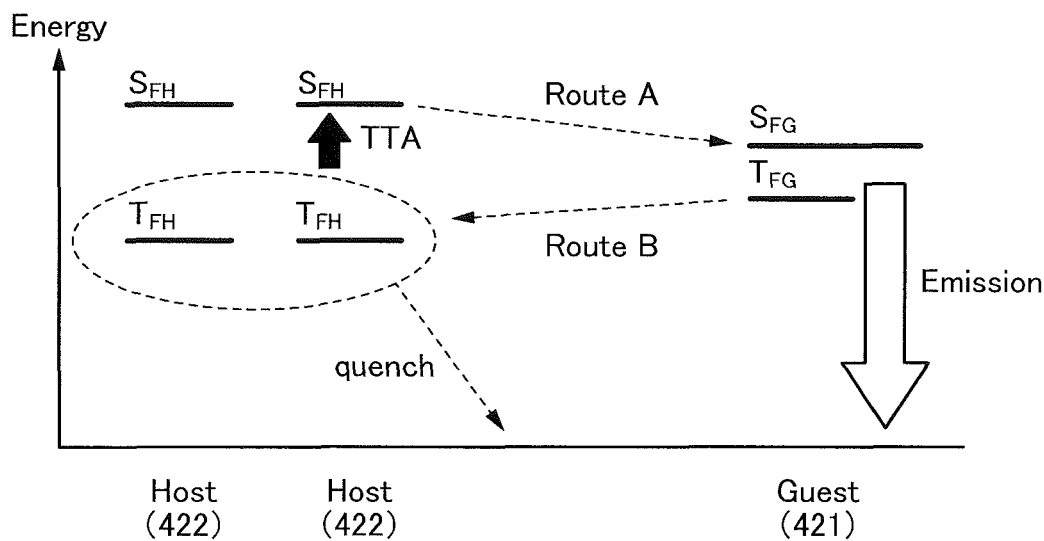
FIGS. 4A and 4B show correlations of energy levels in light-emitting layers.

Next, FIG. 4A shows a correlation of energy levels between the host material 422 and the guest material 421 of the first light-emitting layer 413. The following explains what terms and signs in FIG. 4A represent:

Host: the host material 422;
Guest: the guest material 421 (the fluorescent light-emitting material);
$S_{FH}$: the level of the lowest singlet excited state of the host material 422;
$T_{FH}$: the level of the lowest triplet excited state of the host material 422;
$S_{FG}$: the level of the lowest singlet excited state of the guest material 421 (the fluorescent light-emitting material); and
$T_{FG}$: the level of the lowest triplet excited state of the guest material 421 (the fluorescent light-emitting material).

As shown in FIG. 4A, the $T_1$ level of the guest material ($T_{FG}$ in FIG. 4A) is higher than the $T_1$ level of the host material ($T_{FH}$ in FIG. 4A).

In addition, as shown in FIG. 4A, triplet excitons collide with each other by triplet-triplet annihilation (TTA), and part of energy of them is converted into the level of the lowest singlet excited state of the host material ($S_{FH}$). Energy is transferred from the level of the lowest singlet excited state of the host material ($S_{FH}$) to the level of the lowest singlet excited state of the guest material (the fluorescent light-emitting material) ($S_{FG}$) that is the level lower than $S_{FH}$ (see Route A in FIG. 4A); and thus the guest material (the fluorescent light-emitting material) emits light.

Because the $T_1$ level of the host material is lower than the $T_1$ level of the guest material, energy is transferred from $T_{FG}$ to $T_{FH}$ without deactivation of $T_{FG}$ (see Route B in FIG. 4A) and is utilized for TTA.

When the first light-emitting layer 413 has the above structure, light emission from the guest material 421 of the first light-emitting layer 413 can be efficiently obtained.

<Light Emission Mechanism of Second Light-Emitting Layer>

Next, the light emission mechanism of the second light-emitting layer 414 is described below.

The first organic compound 432 and the second organic compound 433 of the second light-emitting layer 414 form an exciplex. One of the first organic compound 432 and the second organic compound 433 functions as a host material for the second light-emitting layer 414, and the other of the first organic compound 432 and the second organic compound 433 functions as an assist material for the second light-emitting layer 414. Note that the first organic compound 432 serves as the host material and the second organic compound 433 serves as the assist material in the following description.

Although there is no limitation on the combination of the first organic compound 432 and the second organic compound 433 in the second light-emitting layer 414 as long as an exciplex can be formed, it is preferable that one organic compound be a material having a hole-transport property and the other organic compound be a material having an electron-transport property. In that case, a donor-acceptor excited state is formed easily, which allows an exciplex to be formed efficiently. In the case where the combination of the first organic compound 432 and the second organic compound 433 is a combination of the material having a hole-transport property and the material having an electron-transport property, the carrier balance can be easily controlled depending on the mixture ratio. Specifically, the ratio of the material having a hole-transport property to the material having an electron-transport property is preferably within a range of 1:9 to 9:1 (weight ratio). Since the carrier balance can be easily controlled with the structure, a recombination region can also be easily adjusted.

Figure 4B:
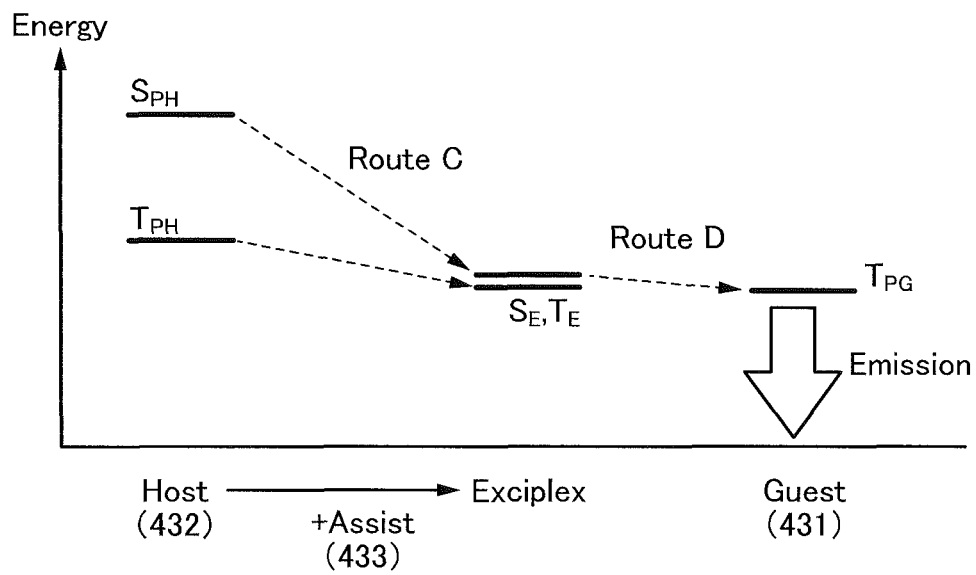

FIG. 4B shows a correlation of energy levels between the first organic compound 432, the second organic compound 433, and the guest material 431 of the second light-emitting layer 414. The following explains what terms and signs in FIG. 4B represent:

Host: the first organic compound 432;
Assist: the second organic compound 433;
Guest: the guest material 431 (the phosphorescent light-emitting material);
$S_{PH}$: the level of the lowest singlet excited state of the host material (the first organic compound 432);
$T_{PH}$: the level of the lowest triplet excited state of the host material (the first organic compound 432);

$T_{PG}$: the level of the lowest triplet excited state of the guest material 431 (the phosphorescent light-emitting material);

$S_E$: the level of the lowest singlet excited state of the exciplex; and $T_E$: the level of the lowest triplet excited state of the exciplex.

In the light-emitting element of one embodiment of the present invention, the first organic compound 432 and the second organic compound 433 of the second light-emitting layer 414 form the exciplex. The level of the lowest singlet excited state of the exciplex ($S_E$) and the level of the lowest triplet excited state of the exciplex ($T_E$) are adjacent to each other (see Route C in FIG. 4B).

An exciplex is an excited state formed from two kinds of molecules. In the case of photoexcitation, the exciplex is formed by interaction between one molecule in an excited state and the other molecule in a ground state. The two kinds of molecules that have formed the exciplex return to a ground state by emitting light and serve as the original two kinds of molecules. In the case of electrical excitation, the exciplex can be formed when a cationic molecule (hole) of one substance comes close to an anionic molecule (electron) of the other substance. That is, the exciplex can be formed without formation of excitation state of either molecule in the electrical excitation; thus, a driving voltage can be lowered. Both energies of $S_E$ and $T_E$ of the exciplex then move to the level of the lowest triplet excited state of the guest material 431 (the phosphorescent light-emitting material) to obtain light emission (see Route D in FIG. 4B).

The above-described process of Route C and Route D is referred to as exciplex-triplet energy transfer (ExTET) in this specification and the like. In other words, in the light-emitting element 450, energy can be given from the exciplex to the guest material 431 (the phosphorescent light-emitting material).

When one of the first organic compound 432 and the second organic compound 433 receiving a hole and the other of the first organic compound 432 and the second organic compound 433 receiving an electron come close to each other, the exciplex is formed at once. Alternatively, when one molecule becomes in an excited state, the exciplex is formed by the interaction between the one and the other immediately. Therefore, most excitons in the second light-emitting layer 414 exist as the exciplexes. A band gap of the exciplex is smaller than those of the first organic compound 432 and the second organic compound 433; therefore, the driving voltage can be lowered when the exciplex is formed by recombination of a hole and an electron.

When the second light-emitting layer 414 has the above structure, light emission from the guest material 431 (the phosphorescent light-emitting material) of the second light-emitting layer 414 can be efficiently obtained.

<Light Emission Mechanism of First and Second Light-Emitting Layers>

Each light emission mechanism of the first light-emitting layer 413 and the second light-emitting layer 414 is described above. As in the light-emitting element 450, in the case where the first light-emitting layer 413 and the second light-emitting layer 414 are in contact with each other, even when energy is transferred from the exciplex to the host material 422 of the first light-emitting layer 413 (in particular, when energy of the triplet excited level is transferred) at an interface between the first light-emitting layer 413 and the second light-emitting layer 414, triplet excitation energy can be converted into light emission in the first light-emitting layer 413.

The $T_1$ level of the host material 422 of the first light-emitting layer 413 is preferably lower than $T_1$ levels of the first organic compound 432 and the second organic compound 433 of the second light-emitting layer 414. In the first light-emitting layer 413, an $S_1$ level of the host material 422 is preferably higher than an $S_1$ level of the guest material 421 (the fluorescent light-emitting material) while the $T_1$ level of the host material 422 is preferably lower than the $T_1$ level of the guest material 421 (the fluorescent light-emitting material).

Figure 5:
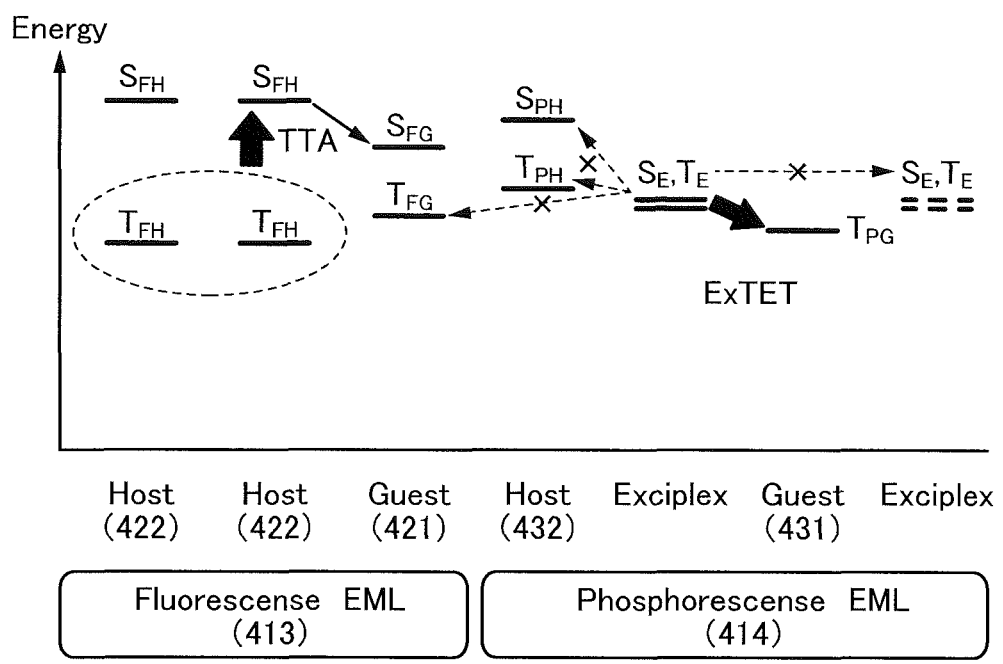
FIG. 5 shows a correlation of energy levels in light-emitting layers.

FIG. 5 shows a correlation of energy levels in the case where TTA is utilized in the first light-emitting layer 413 and ExTET is utilized in the second light-emitting layer 414. The following explains what terms and signs in FIG. 5 represent:

Fluorescence EML: the fluorescent light-emitting layer (the first light-emitting layer 413);

Phosphorescence EML: the phosphorescent light-emitting layer (the second light-emitting layer 414);

$S_{FH}$: the level of the lowest singlet excited state of the host material 422;

$T_{FH}$: the level of the lowest triplet excited state of the host material 422;

$S_{FG}$: the level of the lowest singlet excited state of the guest material 421 (the fluorescent light-emitting material); and $T_{FG}$: the level of the lowest triplet excited state of the guest material 421 (the fluorescent light-emitting material);

$S_{PH}$: the level of the lowest singlet excited state of the host material (the first organic compound 432);

$T_{PH}$: the level of the lowest triplet excited state of the host material (the first organic compound 432);

$T_{PG}$: the level of the lowest triplet excited state of the guest material 431 (the phosphorescent light-emitting material);

$S_E$: the level of the lowest singlet excited state of the exciplex; and $T_E$: the level of the lowest triplet excited state of the exciplex.

As shown in FIG. 5, the exciplex exists only in an excited state; thus, exciton diffusion between the exciplexes is less likely to occur. In addition, because the excited levels of the exciplex ($S_E$ and $T_E$) are lower than the excited levels of the first organic compound 432 (the host material of the phosphorescent light-emitting material) of the second light-emitting layer 414 ($S_{PH}$ and $T_{PH}$), energy diffusion from the exciplex to the first organic compound 432 does not occur. That is, emission efficiency of the phosphorescent light-emitting layer (the second light-emitting layer 414) can be maintained because an exciton diffusion distance of the exciplex is short in the phosphorescent light-emitting layer (the second light-emitting layer 414). In addition, even when part of the triplet excitation energy of the exciplex of the phosphorescent light-emitting layer (the second light-emitting layer 414) diffuses into the fluorescent light-emitting layer (the first light-emitting layer 413) through the interface between the fluorescent light-emitting layer (the first light-emitting layer 413) and the phosphorescent light-emitting layer (the second light-emitting layer 414), energy loss can be reduced because the triplet excitation energy in the fluorescent light-emitting layer (the first light-emitting layer 413) caused by the diffusion is used for light emission through TTA.

The light-emitting element 450 can have high emission efficiency because ExTET is utilized in the second light-emitting layer 414 and TTA is utilized in the first light-emitting layer 413 as described above so that energy loss is reduced. As in the light-emitting element 450, in the case where the first light-emitting layer 413 and the second light-emitting layer 414 are in contact with each other, the number of EL layers 400 as well as the energy loss can be reduced. Therefore, a light-emitting element with low manufacturing cost can be obtained.

Note that the first light-emitting layer 413 and the second light-emitting layer 414 are not necessarily in contact with each other. In that case, it is possible to prevent energy transfer by the Dexter mechanism (particularly triplet energy transfer) from the first organic compound 432 in an excited state or the guest material 431 (the phosphorescent light-emitting material) in an excited state which is generated in the second light-emitting layer 414 to the host material 422 or the guest material 421 (the fluorescent light-emitting material) in the first light-emitting layer 413. Therefore, the thickness of a layer provided between the first light-emitting layer 413 and the second light-emitting layer 414 may be several nanometers.

The layer provided between the first light-emitting layer 413 and the second light-emitting layer 414 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the first organic compound 432) of the second light-emitting layer 414. This facilitates the manufacture of the light-emitting element and reduces the driving voltage. Furthermore, the hole-transport material and the electron-transport material may form an exciplex, which effectively prevents exciton diffusion. Specifically, it is possible to prevent energy transfer from the host material (the first organic compound 432) in an excited state or the guest material 431 (the phosphorescent light-emitting material) in an excited state of the second light-emitting layer 414 to the host material 422 or the guest material 421 (the fluorescent light-emitting material) in the first light-emitting layer 413.

Note that in the light-emitting element 450, a carrier recombination region is preferably distributed to some extent. Therefore, it is preferable that the first light-emitting layer 413 or the second light-emitting layer 414 have an appropriate degree of carrier-trapping property. It is particularly preferable that the guest material 431 (the phosphorescent light-emitting material) in the second light-emitting layer 414 have an electron-trapping property.

Note that light emitted from the first light-emitting layer 413 preferably has a peak on the shorter wavelength side than light emitted from the second light-emitting layer 414. The luminance of a light-emitting element using the phosphorescent light-emitting material emitting light with a short wavelength tends to degrade quickly. In view of the above, fluorescence is used for light emission with a short wavelength, so that a light-emitting element with less degradation of luminance can be provided.

Furthermore, the first light-emitting layer 413 and the second light-emitting layer 414 are made to emit light with different emission wavelengths, so that the light-emitting element can be a multicolor light-emitting element. In that case, the emission spectrum is formed by combining light having different emission peaks, and thus has at least two peaks.

The above structure is suitable for obtaining white light emission. When the first light-emitting layer 413 and the second light-emitting layer 414 emit light of complementary colors, white light emission can be obtained.

In addition, white light emission with a high color rendering property that is formed of three primary colors or four or more colors can be obtained by using a plurality of light-emitting substances emitting light with different wavelengths for the first light-emitting layer 413. In that case, the first light-emitting layer 413 may be divided into layers and each of the divided layers may contain a different light-emitting material from the others.

Next, materials that can be used for the first light-emitting layer 413 and the second light-emitting layer 414 will be described.

<Material that can be Used for First Light-Emitting Layer>

In the first light-emitting layer 413, the host material 422 is present in the highest proportion by weight, and the guest material 421 (the fluorescent light-emitting material) is dispersed in the host material 422. The $S_1$ level of the host material 422 is preferably higher than the $S_1$ level of the guest material 421 (the fluorescent light-emitting material) while the $T_1$ level of the host material 422 is preferably lower than the $T_1$ level of the guest material 421 (the fluorescent light-emitting material).

An anthracene derivative or a tetracene derivative is preferably used as the host material 422. This is because these derivatives each have a high $S_1$ level and a low $T_1$ level. Specific examples include 9-phenyl-3-[4-(10-phenyl-9-anthryl)phenyl]-9H-carbazole (PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Besides, 5,12-diphenyltetracene, 5,12-bis(biphenyl-2-yl)tetracene, and the like can be given.

Examples of the guest material 421 (the fluorescent light-emitting material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Specific examples of the pyrene derivative include N,N'-bis(3-methylphenyl)-N,N-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-diphenylpyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N-bis(dibenzothiophen-2-yl)-N,N'-diphenylpyrene-1,6-diamine (abbreviation: 1,6ThAPrn), and the like.

<Material that can be Used for Second Light-Emitting Layer>

In the second light-emitting layer 414, the host material (the first organic compound 432) is present in the highest proportion in mass ratio, and the guest material 431 (the phosphorescent light-emitting material) is dispersed in the host material (the first organic compound 432). The $T_1$ level of the host material (the first organic compound 432) of the second light-emitting layer 414 is preferably higher than the $T_1$ level of the guest material 421 (the fluorescent light-emitting material) of the first light-emitting layer 413.

Examples of the host material (the first organic compound 432) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine, a carbazole derivative, and the like.

As the guest material 431 (the phosphorescent light-emitting material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

As the second organic compound 433 (the assist material), a substance which can form an exciplex together with the first organic compound 432 is used. In that case, it is preferable that the first organic compound 432, the second organic compound 433, and the guest material 431 (the phosphorescent light-emitting material) be selected such that the emission peak of the exciplex overlaps with an adsorption band, specifically an adsorption band on the longest wavelength side, of a triplet metal to ligand charge transfer (MLCT) transition of the phosphorescent light-emitting material. This makes it possible to provide a light-emitting element with drastically improved emission efficiency. However, if a material exhibiting thermally activated delayed fluorescence (TADF) is used instead of the phosphorescent light-emitting material, it is preferable that an adsorption band on the longest wavelength side be an absorption band of a singlet.

As the light-emitting material included in the second light-emitting layer 414, any material can be used as long as the material can convert the triplet excitation energy into light emission. As an example of the material that can convert the triplet excitation energy into light emission, a TADF material is given in addition to a phosphorescent light-emitting material. Therefore, it is acceptable that the "phosphorescent light-emitting material" in the description is replaced with the "TADF material". Note that the TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV.

There is no limitation on the emission colors of the light-emitting material included in the first light-emitting layer 413 and the light-emitting material included in the second light-emitting layer 414, and they may be the same or different Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material included in the first light-emitting layer 413 is preferably shorter than that of the light-emitting material included in the second light-emitting layer 414.

Note that the structure described in this embodiment can be combined as appropriate with any of the structures described in the other embodiments and the examples.

Embodiment 3

In this embodiment, a light-emitting device including the light-emitting element described in Embodiment 1 or 2 will be described.

The light-emitting device may be either a passive matrix type light-emitting device or an active matrix type light-emitting device. The light-emitting element described in the other embodiments can be applied to the light-emitting device described in this embodiment.

In this embodiment, an active matrix type light-emitting device is described with reference to FIGS. 2A and 2B.

Figure 2A:
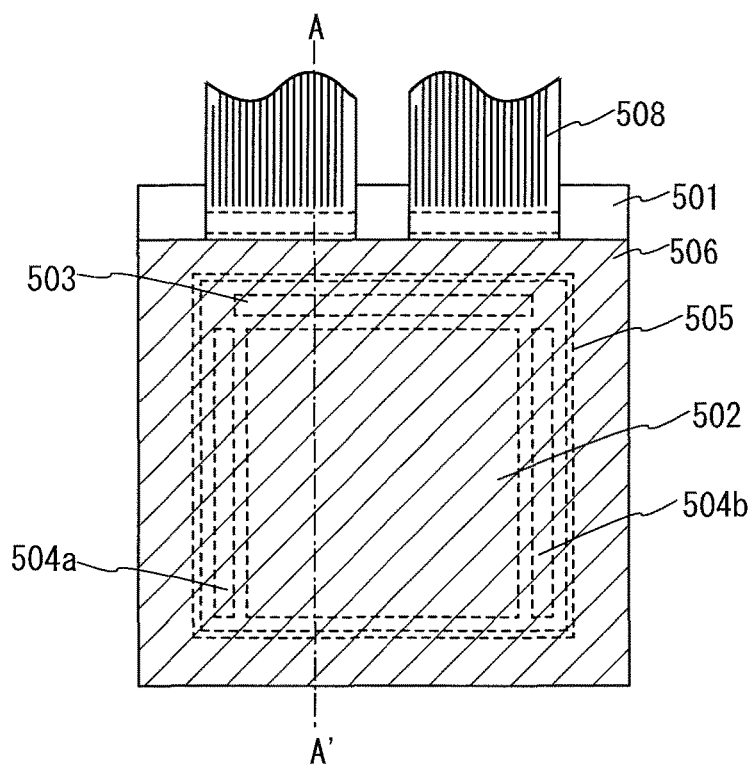
FIGS. 2A and 2B illustrate a structure of a light-emitting element.
Figure 2B:
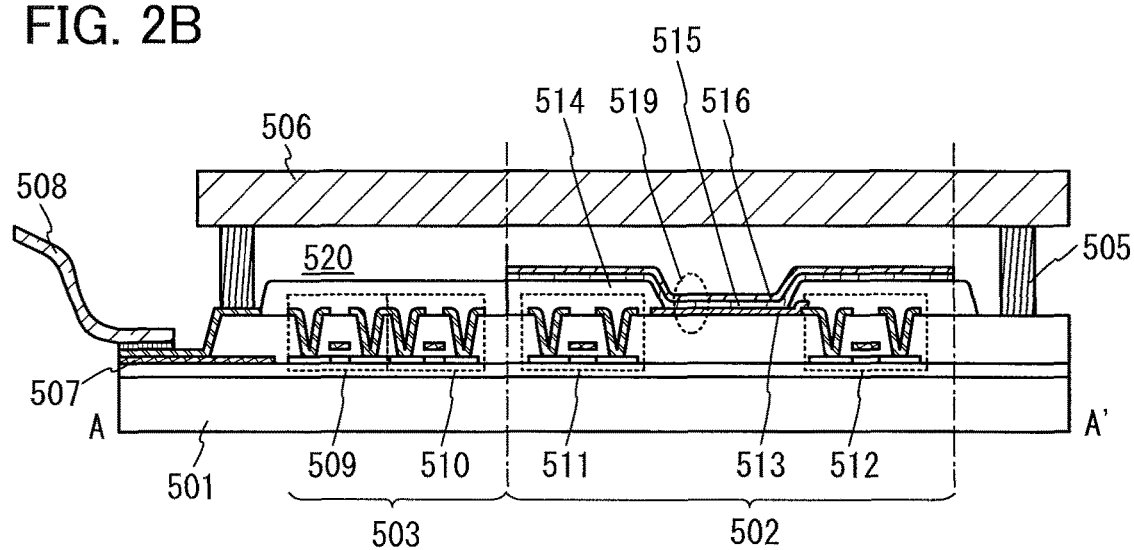

FIG. 2A is a top view illustrating a light-emitting device and FIG. 2B is a cross-sectional view taken along the chain line A-A' in FIG. 2A. The active matrix type light-emitting device according to this embodiment includes a pixel portion 502 provided over an element substrate 501, a driver circuit portion (a source line driver circuit) 503, and driver circuit portions (gate line driver circuits) 504a and 504b. The pixel portion 502, the driver circuit portion 503, and the driver circuit portions 504a and 504b are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portions 504a and 504b, is provided. Here, an example is described in which a flexible printed circuit (FPC) 508 is provided as the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 2B. The driver circuit portion and the pixel portion are formed over the element substrate 501; the driver circuit portion 503 which is the source line driver circuit and the pixel portion 502 are illustrated here.

The driver circuit portion 503 is an example where a CMOS circuit is formed, which is a combination of an n-channel FET 509 and a p-channel FET 510. Note that a circuit included in the driver circuit portion may be formed using various CMOS circuits, PMOS circuits, or NMOS circuits. Any of a staggered type FET and a reverse-staggered type FET can be used. The crystallinity of a semiconductor film used in the FET is not limited and can be amorphous or crystalline. In addition, an oxide semiconductor may be used for a semiconductor layer. Although a driver integrated type in which the driver circuit is formed over the substrate is described in this embodiment, the driver circuit is not necessarily formed over the substrate, and the driver circuit can be formed outside.

The pixel portion 502 is formed of a plurality of pixels each of which includes a switching FET 511, a current control FET 512, and an electrode 513 which is electrically connected to a wiring (a source electrode or a drain electrode) of the current control FET 512. An insulator 514 is formed to cover edge portions of the electrode 513. Here the insulator 514 is formed using a positive photosensitive acrylic resin. The electrode 513 may function as an anode of the light-emitting element. Although FIG. 2B illustrates one light-emitting element of the pixel portion 502, the pixel portion 502 includes a plurality of light-emitting elements in one embodiment of the present invention. There are at least two kinds of light-emitting elements in each of which the material of a region of the electrode 513, which is in contact with an EL layer, is different.

The insulator 514 preferably has a curved surface with curvature at an upper edge portion or a lower edge portion thereof in order to obtain favorable coverage by a film which is to be stacked over the insulator 514. For example, in the case of using a positive photosensitive acrylic resin as a material for the insulator 514, the insulator 514 is preferably formed so as to have a curved surface with a curvature radius (0.2 μm to 3 μm) at the upper edge portion. The insulator 514 can be formed using either a negative photosensitive resin or a positive photosensitive resin. The material of the insulator 514 is not limited to an organic compound and an inorganic compound such as silicon oxide or silicon oxynitride can also be used.

Over the electrode 513, an EL layer 515 and an electrode 516 are stacked. The electrode 516 may function as a cathode. At least a light-emitting layer is provided in the EL layer 515. Furthermore, in the EL layer 515, a hole-injection layer, a hole-transport layer, an electron-transport layer, an electron-injection layer, and the like can be provided as appropriate in addition to the light-emitting layer.

Not that for the element substrate 501, the electrode 513, the EL layer 515, and the electrode 516, the materials used for the anode or the cathode, which are described in Embodiment 1, can be used. Although not illustrated, the electrode 516 is electrically connected to an FPC 508 which is an external input terminal.

In addition, although the cross-sectional view of FIG. 2B illustrates only one light-emitting element 519, as described above, there are a plurality of light-emitting elements in the pixel portion 502, which are arranged in a matrix. Light-emitting elements that emit light of three kinds of colors (R, G, and B) are selectively formed in the pixel portion 502, whereby a light-emitting device capable of full color display can be obtained. Alternatively, a light-emitting device capable of full color display may be fabricated by a combination with color filters.

Furthermore, the sealing substrate 506 is attached to the element substrate 501 with the sealant 505, whereby the light-emitting element 519 is provided in a space 520 surrounded by the element substrate 501, the sealing substrate 506, and the sealant 505. Note that the space 520 may be filled with an inert gas (such as nitrogen and argon) or the sealant 505.

An epoxy-based resin is preferably used for the sealant 505. The material preferably allows as little moisture and oxygen as possible to penetrate. As the sealing substrate 506, a glass substrate, a quartz substrate, or a plastic substrate formed of fiber-reinforced plastic (FRP), poly(vinyl fluoride) (PVF), polyester, acrylic, or the like can be used.

As described above, the active matrix type light-emitting device can be obtained.

Note that the structure described in this embodiment can be combined as appropriate with any of the structures described in the other embodiments and the examples.

Embodiment 4

In this embodiment, a light-emitting device fabricated using the light-emitting element of one embodiment of the present invention will be described with reference to FIG. 6.

Figure 6:
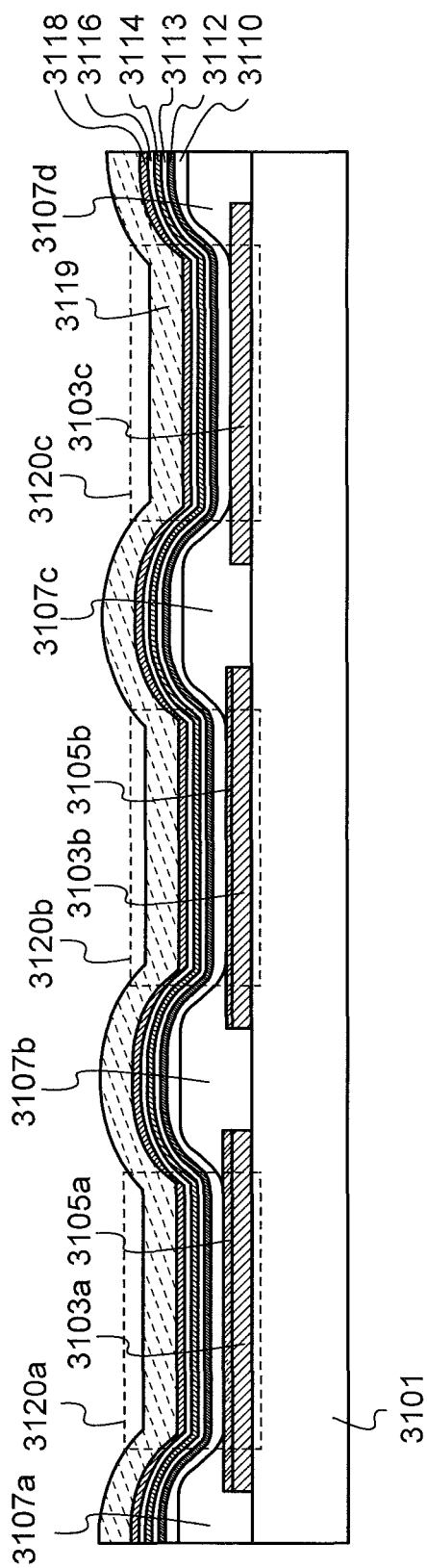
FIG. 6 illustrates a structure of a light-emitting element.

A light-emitting device 3100 illustrated in FIG. 6 includes light-emitting elements 3120a, 3120b, and 3120c. The light-emitting elements 3120a, 3120b, and 3120c are light-emitting elements in which light-emitting layers are provided between lower electrodes 3103a, 3103b, and 3103c and an upper electrode 3119.

The light-emitting device 3100 includes the island-shaped lower electrodes 3103a, 3103b, and 3103c over a substrate 3101. Note that reflective electrodes may be provided under the lower electrodes 3103a, 3103b, and 3103c. Conductive layers 3105a and 3105b may be provided over the lower electrodes 3103a and 3103b. The conductive layers 3105a and 3105b may have light-transmitting properties and may have different thicknesses in elements that emit light of different colors. The lower electrodes 3103a, 3103b, and 3103c can each function as an anode of the light-emitting element. Alternatively, the lower electrodes 3103a and 3103b can function as anodes together with the conductive layers 3105a and 3105b, respectively.

Furthermore, the light-emitting device 3100 includes partitions 3107a, 3107b, 3107c, and 3107d. Specifically, the partition 3107a covers one edge portion of the lower electrode 3103a and one edge portion of the conductive layer 3105a. The partition 3107b covers the other edge portion of the lower electrode 3103a and the other edge portion of the conductive layer 3105a and also covers one edge portion of the lower electrode 3103b and one edge portion of the conductive layer 3105b. The partition 3107c covers the other edge portion of the lower electrode 3103b and the other edge portion of the conductive layer 3105b and also covers one edge portion of the lower electrode 3103c. The partition 3107d covers the other edge portion of the lower electrode 3103c.

The light-emitting device 3100 includes a hole-injection layer 3110 over the lower electrodes 3103a, 3103b, and 3103c and the partitions 3107a, 3107b, 3107c, and 3107d; a hole-transport layer 3112 over the hole-injection layer 3110; a first light-emitting layer 3113 over the hole-transport layer 3112; a second light-emitting layer 3114 over the first light-emitting layer 3113; an electron-transport layer 3116 over the second light-emitting layer 3114; an electron-injection layer 3118 over the electron-transport layer 3116; and the upper electrode 3119 over the electron-injection layer 3118.

Note that the light-emitting device 3100 may include another layer between the first light-emitting layer 3113 and the second light-emitting layer 3114.

In the light-emitting device 3100, the hole-injection layer 3110, which forms the EL layer, is not in contact with a common electrode among all elements. That is, the hole-injection layer 3110 is in contact with the lower electrode 3103c in the light-emitting element 3120c, and is in contact with the conductive layers 3105a and 3105b in the light-emitting elements 3120a and 3120b, respectively.

In one embodiment of the present invention, for example, the lower electrode 3103c and the conductive layers 3105a and 3105b are formed as anodes using different materials. Thus, the work function of the anode in each of the light-emitting elements 3120a and 3120b are not consistent with that in the light-emitting element 3120c; therefore, a carrier-injection property of the anode to the EL layer is different. Thus, a region in which carriers are recombined is distributed differently in each light-emitting element.

For example, in the case where ITO having a relatively high work function is used for the conductive layers 3105a and 3105b and Ti having a relatively low work function is used for the lower electrode 3103c, in the light-emitting elements 3120*a* and 3120*b*, regions in which carriers are recombined are distributed at a high density on the upper electrode 3119 side, and in the light-emitting element 3120*c*, a region in which carriers are recombined is distributed at a high density on the lower electrode 3103*c* side. Therefore, the distribution of the regions in which carriers are recombined in the second light-emitting layer 3114 tends to be localized in the light-emitting elements 3120*a* and 3120*b* compared with that in the light-emitting element 3120*c*.

Therefore, for example, in the case where the first light-emitting layer 3113 contains a fluorescent light-emitting material that can emit blue light and the second light-emitting layer 3114 contains a phosphorescent light-emitting material that can emit light different from blue light, the light-emitting element 3120*c* emits light having relatively high intensity in a blue wavelength range with low power consumption. In contrast, in the light-emitting elements 3120*a* and 3120*c*, light emission having relatively high intensity in a wavelength range different from the blue wavelength range can be obtained with low power consumption. For example, a region having the light-emitting element 3120*c* is used as a subpixel for extracting blue light, and a region having the light-emitting element 3120*a* and a region having the light-emitting element 3120*b* are used as a subpixel for extracting red light and a subpixel for extracting green light, respectively, whereby the power consumption for driving the light-emitting device 3100 can be reduced.

Although the cost of a material used for the EL layer is relatively high, the EL layer of the light-emitting device 3100 of one embodiment of the present invention does not need to be coated separately for subpixels and a common EL layer with one stacked-layer structure can be formed in all light-emitting elements. Therefore, a light-emitting device which can be driven with low power consumption can be manufactured at low cost.

In the case where EL layers are coated separately for subpixels, it is necessary to provide a partition serving as a space (margin) between subpixels and having a certain size. However, since the common EL layer can be formed in subpixels in the light-emitting device of one embodiment of the present invention, the partition can be made small. Therefore, a high-resolution panel having higher pixel density can be manufactured.

Note that the structure described in this embodiment can be combined as appropriate with any of the structures described in the other embodiments and the examples.

Embodiment 5

In this embodiment, examples of a variety of electronic appliances fabricated using a light-emitting device including the light-emitting element described in Embodiment 1 will be described with reference to FIGS. 7A to 7D.

Examples of electronic appliances that include the light-emitting device include television devices (also referred to as TV or television receivers), monitors for computers and the like, cameras such as digital cameras and digital video cameras, digital photo frames, cellular phones (also referred to as portable telephone devices), portable game consoles, portable information terminals, audio playback devices, large game machines such as pin-ball machines, and the like. Specific examples of these electronic appliances are illustrated in FIGS. 7A to 7D.

Figure 7A:
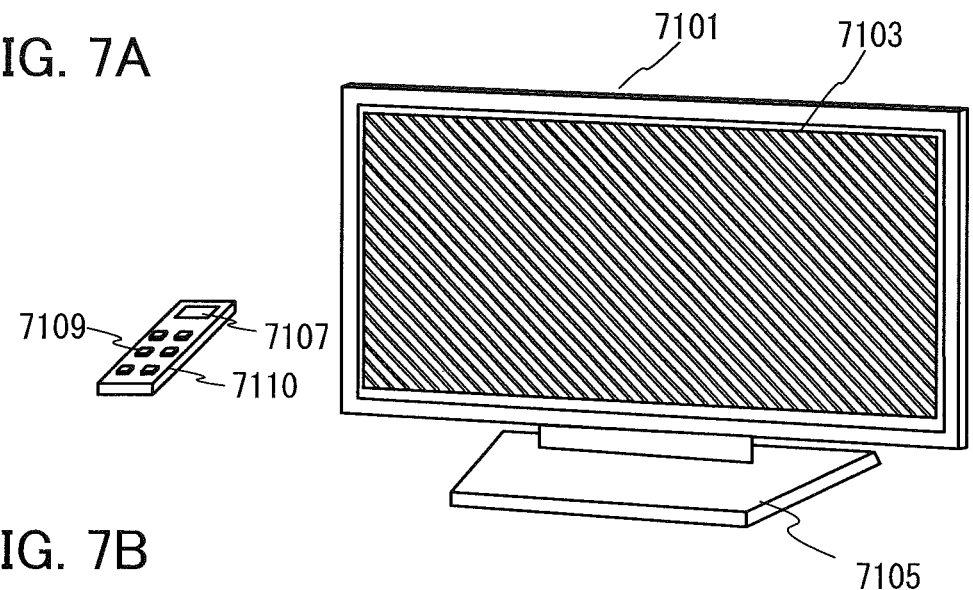
FIGS. 7A to 7D each illustrate an electronic appliance.

FIG. 7A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105. Note that the display portion 7103 includes the light-emitting device in which the light-emitting elements described in Embodiment 1 are arranged in a matrix.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wirings via the modem, one-way (from a sender to a receiver) or two-way (between a sender and a receiver or between receivers) information communication can be performed.

Figure 7B:
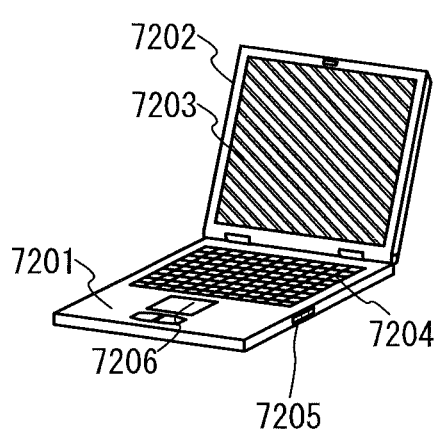

FIG. 7B illustrates a computer, which includes a main body 7201, a housing 7202, a display portion 7203, a keyboard 7204, an external connection port 7205, a pointing device 7206, and the like. Note that this computer is manufactured using the light-emitting device for the display portion 7203. Note that the display portion 7203 includes the light-emitting device in which the light-emitting elements described in Embodiment 1 are arranged in a matrix.

Figure 7C:
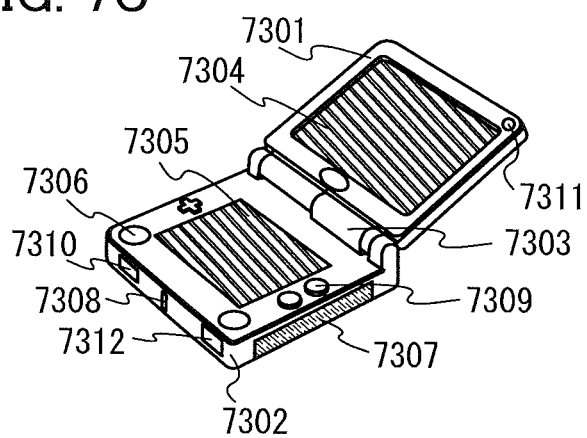

FIG. 7C illustrates a portable game console, which includes two housings, i.e., a housing 7301 and a housing 7302, connected to each other via a joint portion 7303 so that the portable game console can be opened or closed. A display portion 7304 is incorporated in the housing 7301 and a display portion 7305 is incorporated in the housing 7302. Note that the display portions 7304 and 7305 include the light-emitting device in which the light-emitting elements described in Embodiment 1 are arranged in a matrix.

In addition, the portable game console illustrated in FIG. 7C includes a speaker portion 7306, a recording medium insertion portion 7307, an LED lamp 7308, an input means (an operation key 7309, a connection terminal 7310, a microphone 7312, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. It is needless to say that the structure of the portable game console is not limited to the above as long as the light-emitting device is used for at least either the display portion 7304 or the display portion 7305, or both, and may include other accessories as appropriate.

The portable game console illustrated in FIG. 7C has a function of reading out a program or data stored in a storage medium to display it on the display portion, and a function of sharing information with another portable game console by wireless communication. Note that the portable game console illustrated in FIG. 7C can have a variety of functions without limitation thereon.

Figure 7D:
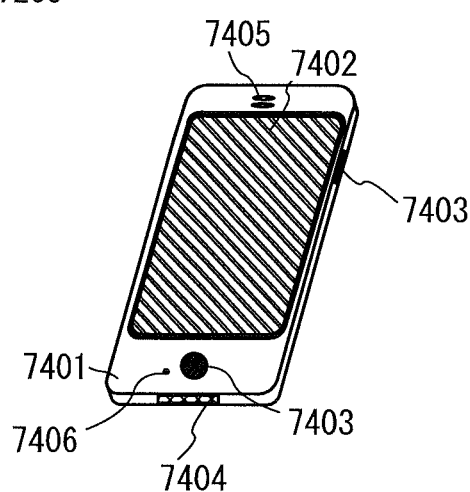

FIG. 7D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device for the display portion 7402. Note that the display portion 7402 includes the light-emitting device in which the light-emitting elements described in Embodiment 1 are arranged in a matrix.

When the display portion 7402 of the cellular phone 7400 illustrated in FIG. 7D is touched with a finger or the like, data can be input into the cellular phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or composing an email, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyro sensor or an acceleration sensor is provided inside the cellular phone 7400, display on the screen of the display portion 7402 can be automatically changed by determining the orientation of the cellular phone 7400 (whether the cellular phone is placed horizontally or vertically).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when it is determined that input by touch on the display portion 7402 is not performed within a specified period on the basis of a signal detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. In addition, when a sensing light source which emits near-infrared light is provided in the display portion, an image of a finger vein, a palm vein, or the like can be taken.

Figure 8A:
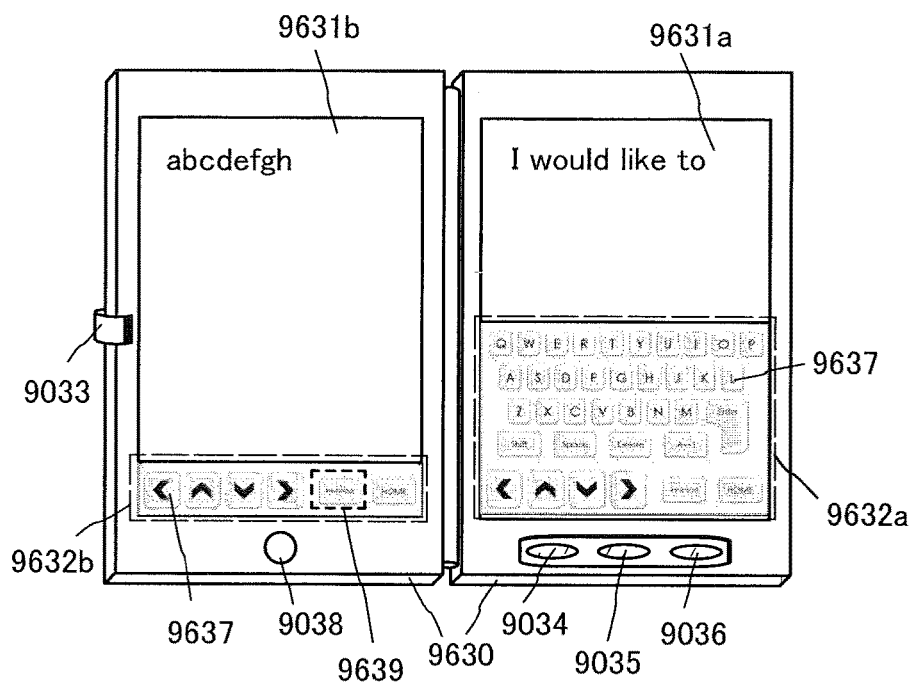
FIGS. 8A to 8C illustrate an electronic appliance.
Figure 8B:
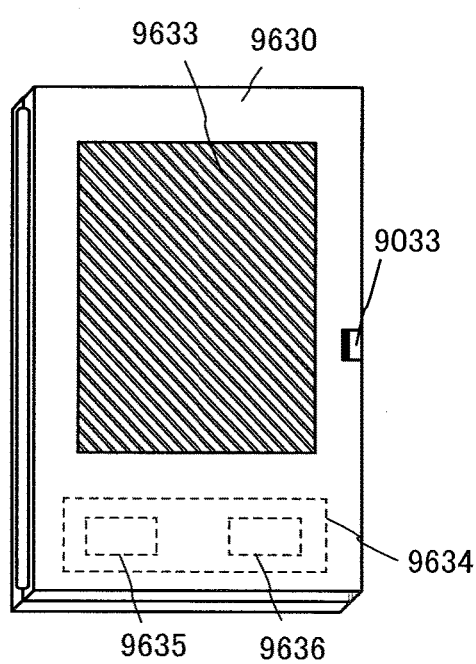

FIGS. 8A and 8B illustrate a foldable tablet terminal. The tablet terminal is opened in FIG. 8A. The tablet terminal includes a housing 9630, a display portion 9631a, a display portion 9631b, a display mode switch 9034, a power switch 9035, a switch 9036 for switching to power-saving mode, a clasp 9033, and an operation switch 9038. The tablet terminal is manufactured using the light-emitting device for either the display portion 9631a or the display portion 9631b or both. Note that one or both of the display portions 9631a and 9631b include a light-emitting device in which the light-emitting elements described in Embodiment 1 are arranged in a matrix.

Part of the display portion 9631a can be a touch panel region 9632a and data can be input when a displayed operation key 9637 is touched. Although a structure in which a half region in the display portion 9631a has only a display function and the other half region has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

With the switch 9034 for switching display modes, the display orientation can be switched (e.g., between landscape mode and portrait mode) and a display mode (e.g., monochrome display or color display) can be selected. The switch 9036 for switching to power-saving mode can control display luminance in accordance with the amount of external light in use of the tablet terminal that is measured with an optical sensor incorporated in the tablet terminal. The tablet terminal may include another detection device such as a gyro sensor or an acceleration sensor in addition to the optical sensor.

Note that FIG. 8A shows an example in which the display portion 9631a and the display portion 9631b have the same display area; however, without limitation thereon, one of the display portions may be different from the other display portion in size and display quality. For example, higher definition images may be displayed on one of the display portions 9631a and 9631b.

The tablet terminal is closed in FIG. 8B. The tablet terminal includes the housing 9630, a solar cell 9633, a charge and discharge control circuit 9634, a battery 9635, and a DCDC converter 9636.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

The tablet terminal illustrated in FIGS. 8A and 8B can also have a function of displaying various kinds of data, such as a calendar, a date, or the time, on the display portion as a still image, a moving image, and a text image, a function of displaying, a touch-input function of operating or editing data displayed on the display portion by touch input, a function of controlling processing by various kinds of software (programs), and the like.

The solar cell 9633 provided on a surface of the tablet terminal can supply power to the touch panel, the display portion, a video signal processing portion, or the like. Note that the solar cell 9633 can be provided for one or both of the display portion 9631a and the display portion 9631b and the battery 9635 can be charged efficiently. When a lithium ion battery is used as the battery 9635, there is an advantage of downsizing or the like.

Figure 8C:
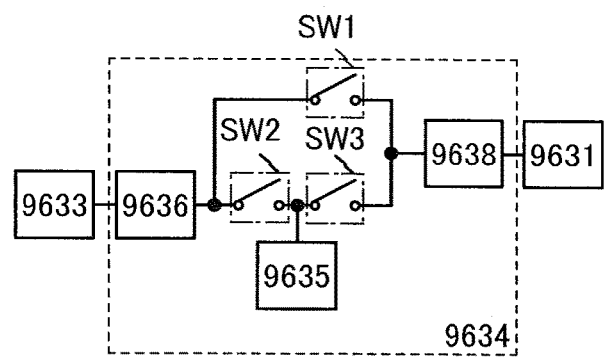

The structure and the operation of the charge and discharge control circuit 9634 illustrated in FIG. 8B are described with reference to a block diagram in FIG. 8C. The solar cell 9633, the battery 9635, the DCDC converter 9636, a converter 9638, switches SW1 to SW3, and the display portion 9631 are illustrated in FIG. 8C, and the battery 9635, the DCDC converter 9636, the converter 9638, and the switches SW1 to SW3 correspond to those in the charge and discharge control circuit 9634 illustrated in FIG. 8B.

An example of the operation in the case where power is generated by the solar cell 9633 using external light is described. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9638 so as to be a voltage needed for the display portion 9631. In addition, when display on the display portion 9631 is not performed, the switch SW1 is turned off and the switch SW2 is turned on so that the battery 9635 is charged.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

As described above, the light-emitting elements included in the light-emitting device of the aforementioned electronic appliances are the light-emitting elements described in Embodiment 1 or 2 and have high emission efficiency, low driving voltage, and a long lifetime. Hence, electronic appliances with reduced power consumption, low driving voltage, and high reliability can be manufactured. It is needless to say that one embodiment of the present invention is not particularly limited to the electronic appliances illustrated in FIGS. 8A to 8C as long as the display portion described in the above embodiment is included.

As described above, the electronic appliances can be obtained by application of the light-emitting device of one embodiment of the present invention. The light-emitting device has a significantly wide application range, and can be applied to electronic appliances in a variety of fields.

Note that the structure described in this embodiment can be combined as appropriate with any of the structures described in the other embodiments and the examples.

Embodiment 6

In this embodiment, a light-emitting device fabricated using the light-emitting element of one embodiment of the present invention will be described with reference to FIGS. 9A and 9B.

Figure 9A:
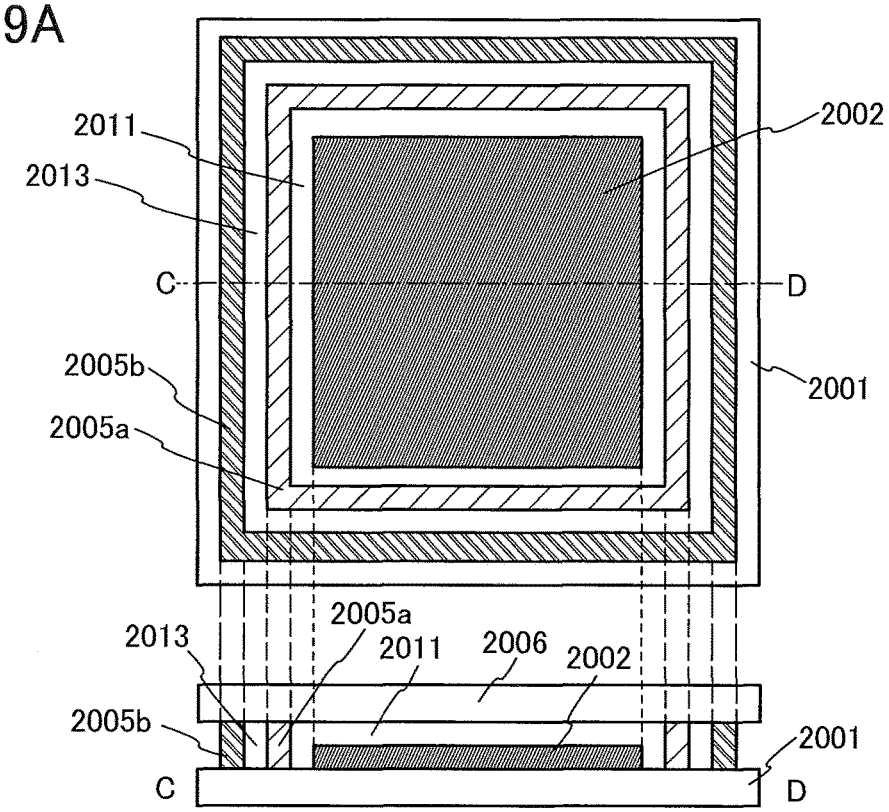
FIGS. 9A and 9B each illustrate a light-emitting device.

In FIG. 9A, a plan view of a light-emitting device described in this embodiment and a cross-sectional view taken along the dashed-dotted line C-D in the plan view are illustrated.

The light-emitting device illustrated in FIG. 9A includes a light-emitting portion 2002 including the light-emitting element of one embodiment of the present invention over a first substrate 2001. The light-emitting device has a structure in which a first sealant 2005a is provided so as to surround the light-emitting portion 2002 and a second sealant 2005b is provided so as to surround the first sealant 2005a (i.e., a double sealing structure).

Thus, the light-emitting portion 2002 is positioned in a space surrounded by the first substrate 2001, a second substrate 2006, and the first sealant 2005a. The light-emitting portion 2002 includes the light-emitting element of one embodiment of the present invention.

Note that in this specification, the first sealant 2005a and the second sealant 2005b are not necessarily in contact with the first substrate 2001 and the second substrate 2006. For example, the first sealant 2005a may be in contact with an insulating film or a conductive film formed over the first substrate 2001.

In the above structure, the first sealant 2005a is a resin layer containing a desiccant and the second sealant 2005b is a glass layer, whereby an effect of suppressing entry of moisture and oxygen from the outside (hereinafter referred to as a sealing property) can be increased.

The first sealant 2005a is the resin layer as described above, whereby the glass layer that is the second sealant 2005b can be prevented from having breaking or cracking (hereinafter collectively referred to as a crack). Furthermore, in the case where the sealing property of the second sealant 2005b is not sufficient, even when impurities such as moisture and oxygen enter a first space 2013, entry of the impurities into a second space 2011 can be suppressed because of a high sealing property of the first sealant 2005a. Thus, deterioration of an organic compound, a metal material, and the like contained in the light-emitting element due to entry of impurities can be suppressed.

Figure 9B:
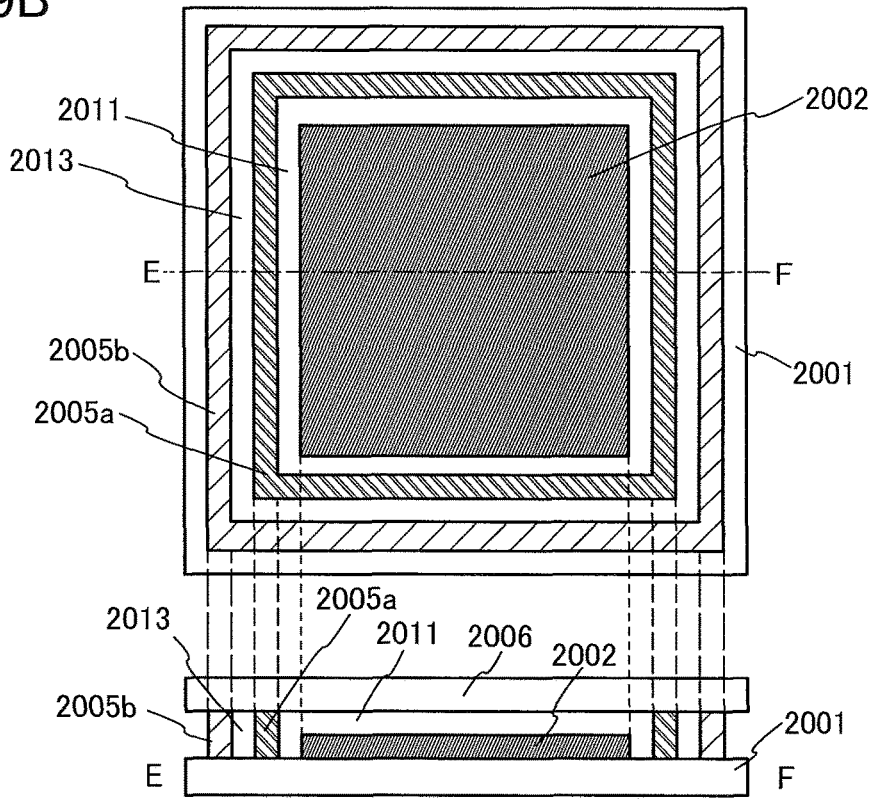

In addition, the structure illustrated in FIG. 9B can be employed: the first sealant 2005a is a glass layer and the second sealant 2005b is a resin layer containing a desiccant.

In the light-emitting device described in this embodiment, distortion due to external force or the like increases toward the outer portion of the light-emitting device. In view of this, the first sealant 2005a which has relatively small distortion due to external force or the like is a glass layer and the second sealant 2005b is a resin layer which has excellent impact resistance and excellent heat resistance and is hardly broken by deformation due to external force or the like, whereby entry of moisture and oxygen into the first space 2013 can be suppressed.

In addition to the above structure, a material serving as a desiccant may be contained in each of the first space 2013 and the second space 2011.

In the case where the first sealant 2005a or the second sealant 2005b is a glass layer, for example, a glass frit, a glass ribbon, or the like can be used. Note that at least a glass material is contained in a glass flit or a glass ribbon.

The glass frit contains a glass material as a frit material. The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, borosilicate glass, or the like. The glass frit preferably contains at least one or more kinds of transition metals to absorb infrared light.

Furthermore, in the case where a glass layer is formed using any of the above glass frits, for example, a frit paste is applied to a substrate and is subjected to heat treatment, laser light irradiation, or the like. The frit paste contains the frit material and a resin (also referred to as a binder) diluted with an organic solvent. The frit paste can be formed using a variety of materials and can employ a variety of structures. An absorber which absorbs light having a wavelength of laser light may be added to the flit material. For example, an Nd:YAG laser, a semiconductor laser, or the like is preferably used as a laser. The shape of laser light may be circular or quadrangular.

Note that the thermal expansion coefficient of the glass layer to be formed is preferably close to that of the substrate. The closer the thermal expansion coefficients are, the more generation of a crack in the glass layer or the substrate due to thermal stress can be suppressed.

Although any of a variety of materials, for example, photocurable resins such as an ultraviolet curable resin, thermosetting resins, and the like can be used in the case where the first sealant 2005*a* or the second sealant 2005*b* is a resin layer, it is particularly preferable to use a material which does not transmit moisture or oxygen. In particular, a photocurable resin is preferably used. The light-emitting element contains a material having low heat resistance in some cases. A photocurable resin, which is cured by light irradiation, is preferably used, in which case change in film quality and deterioration of an organic compound itself caused by heating of the light-emitting element can be suppressed. Furthermore, any of the organic compounds that can be used for the light-emitting element of one embodiment of the present invention may be used.

As the desiccant contained in the resin layer, the first space 2013, or the second space 2011, a variety of materials can be used. As the desiccant, a material which adsorbs moisture by chemical adsorption or a material which adsorbs moisture by physical adsorption can be used. Examples thereof are alkali metal oxides, alkaline earth metal oxide (e.g., calcium oxide, barium oxide, and the like), sulfate, metal halides, perchlorate, zeolite, silica gel, and the like.

One or both of the first space 2013 and the second space 2011 may have, for example, an inert gas such as a rare gas or a nitrogen gas or may contain an organic resin or the like. Note that these spaces are each in an atmospheric pressure state or a reduced pressure state.

As described above, the light-emitting device described in this embodiment has a double sealing structure, in which one of the first sealant 2005*a* and the second sealant 2005*b* is the glass layer having excellent productivity and an excellent sealing property, and the other is the resin layer which has excellent impact resistance and excellent heat resistance and is hardly broken by deformation due to external force or the like, and can contain the desiccant inside, so that a sealing property of suppressing entry of impurities such as moisture and oxygen from the outside can be improved.

Thus, the use of the structure described in this embodiment can provide a light-emitting device in which deterioration of a light-emitting element due to impurities such as moisture and oxygen is suppressed.

Note that the structure described in this embodiment can be combined as appropriate with any of the structures described in the other embodiments and the examples.

Embodiment 7

In this embodiment, a touch sensor and a module that can be combined with a light-emitting device of one embodiment of the present invention will be described with reference to FIGS. 10A and 10B, FIG. 11, FIG. 12, and FIG. 13.

Figure 10A:
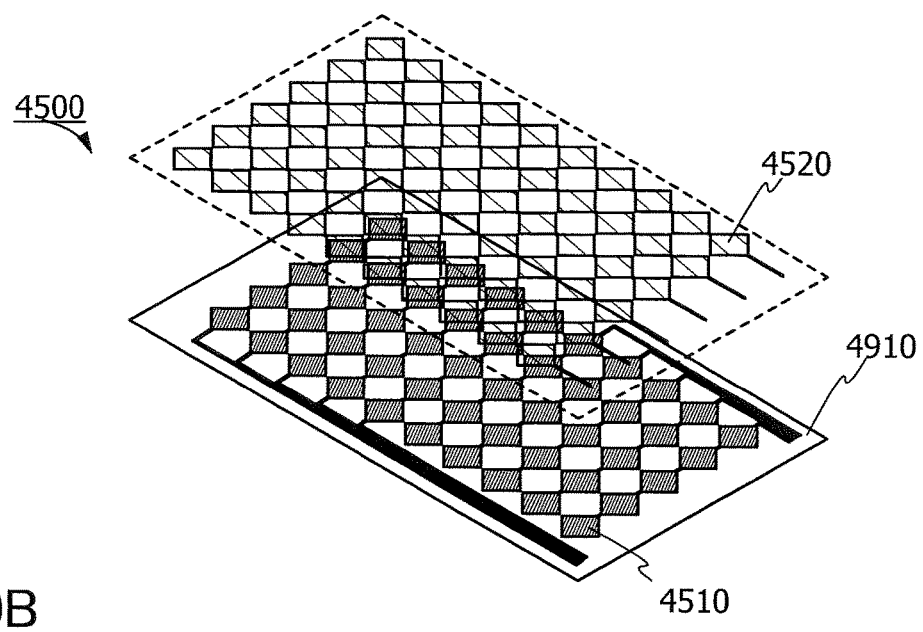
FIGS. 10A and 10B illustrate a touch sensor.
Figure 10B:
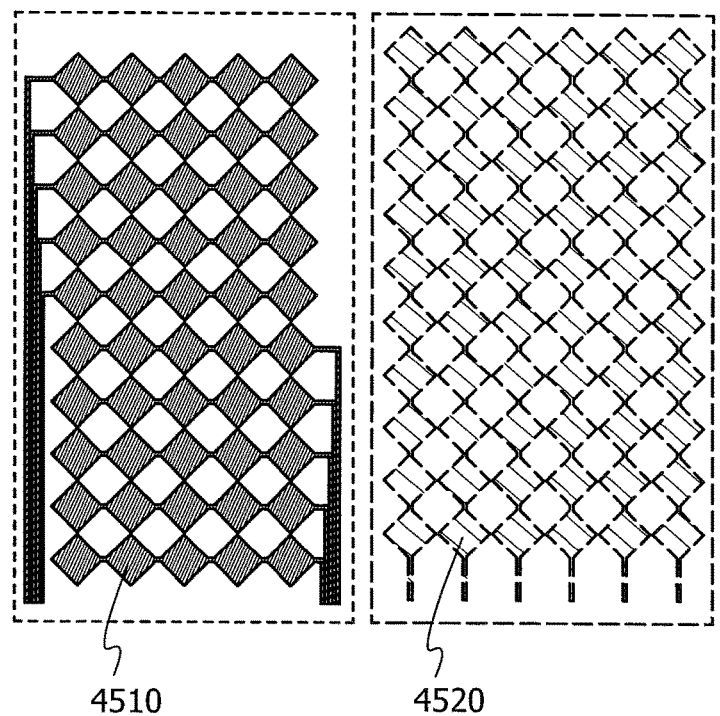

FIG. 10A is an exploded perspective view of a structural example of a touch sensor 4500. FIG. 10B is a plan view of a structural example of the touch sensor 4500.

The touch sensor 4500 illustrated in FIGS. 10A and 10B includes, over a substrate 4910, a plurality of conductive layers 4510 arranged in the X-axis direction and a plurality of conductive layers 4520 arranged in the Y-axis direction intersecting with the X-axis direction. In FIGS. 10A and 10B illustrating the touch sensor 4500, a plane over which the plurality of conductive layers 4510 are formed and a plane over which the plurality of conductive layers 4520 are formed are separately illustrated.

Figure 11:
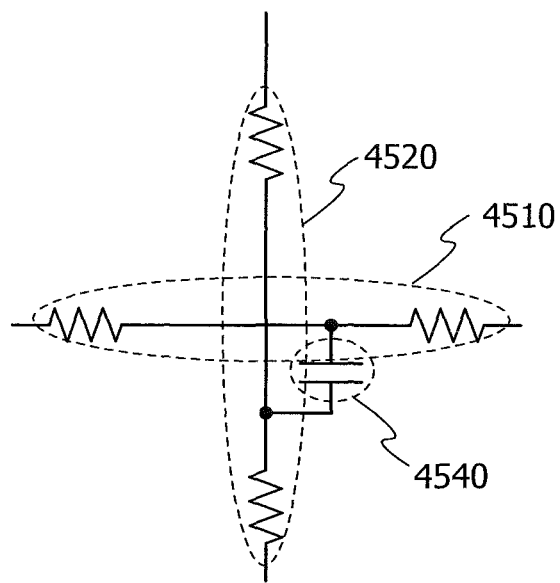
FIG. 11 is a circuit diagram illustrating a touch sensor.

FIG. 11 is an equivalent circuit diagram of an intersection portion of the conductive layer 4510 and the conductive layer 4520. As illustrated in FIG. 11, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 do not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 12:
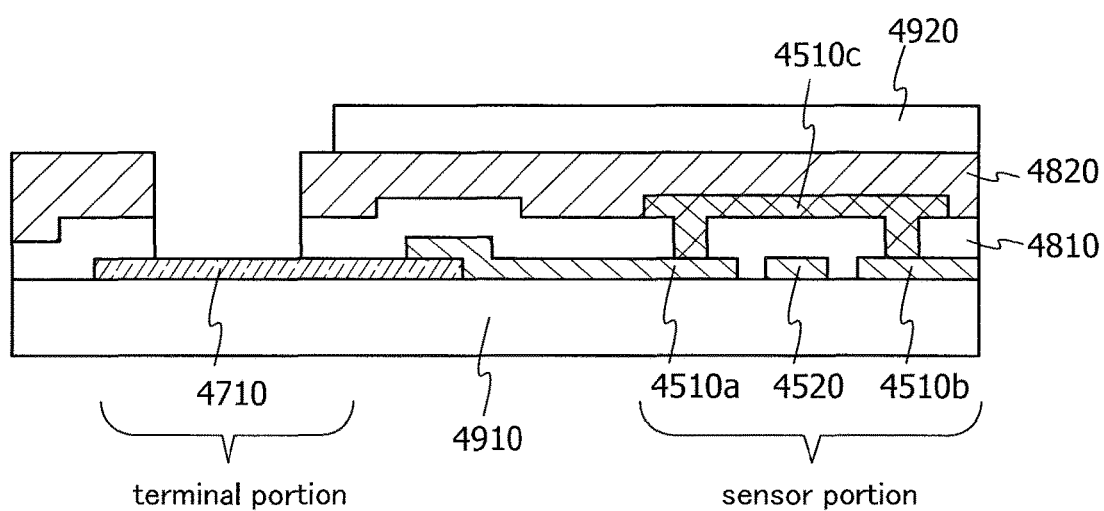
FIG. 12 is a cross-sectional view illustrating a touch sensor.

FIG. 12 is a cross-sectional view illustrating an example of a connection structure between conductive layers 4510*a*, 4510*b*, and 4510*c* and the conductive layer 4520 of the touch sensor 4500 in FIGS. 10A and 10B. FIG. 12 illustrates, as an example, a cross-sectional view of a portion where the conductive layers 4510 (the conductive layers 4510*a*, 4510*b*, and 4510*c*) intersects with the conductive layer 4520.

As illustrated in FIG. 12, the conductive layers 4510 include the conductive layer 4510*a* and the conductive layer 4510*b* in the first layer and the conductive layer 4510*c* in the second layer over an insulating layer 4810. The conductive layer 4510*a* and the conductive layer 4510*b* are connected by the conductive layer 4510*c*. The conductive layer 4520 is formed using the conductive layer in the first layer. An insulating layer 4820 is formed so as to cover the conductive layers 4510 and 4520 and part of a conductive layer 4710. As the insulating layers 4810 and 4820, silicon oxynitride films are formed, for example. A base film formed using an insulating film may be provided between the substrate 4910 and the conductive layers 4710, 4510*a*, 4510*b*, and 4520. As the base film, for example, a silicon oxynitride film can be formed.

The conductive layers 4510*a*, 4510*b*, and 4510*c* and the conductive layer 4520 are formed using a conductive material that transmits visible light, such as indium tin oxide containing silicon oxide, indium tin oxide, zinc oxide, indium zinc oxide, or zinc oxide to which gallium is added.

The conductive layer 4510*a* is connected to the conductive layer 4710. A terminal for connection to an FPC is formed using the conductive layer 4710. The conductive layer 4520 is connected to the conductive layer 4710 like the conductive layer 4510*a*. The conductive layer 4710 can be formed of, for example, a tungsten film.

The insulating layer 4820 is formed so as to cover the conductive layers 4510 and 4520 and the conductive layer 4710. An opening is formed in the insulating layers 4810 and 4820 over the conductive layer 4710 so that the conductive layer 4710 is electrically connected to the FPC. A substrate 4920 is attached to the insulating layer 4820 using an adhesive, an adhesive film, or the like. The substrate 4910 side is bonded to a color filter substrate of a display panel with an adhesive or an adhesive film, so that a touch panel is completed.

Next, a module that can be formed using a light-emitting device of one embodiment of the present invention is described with reference to FIG. 13.

Figure 13:
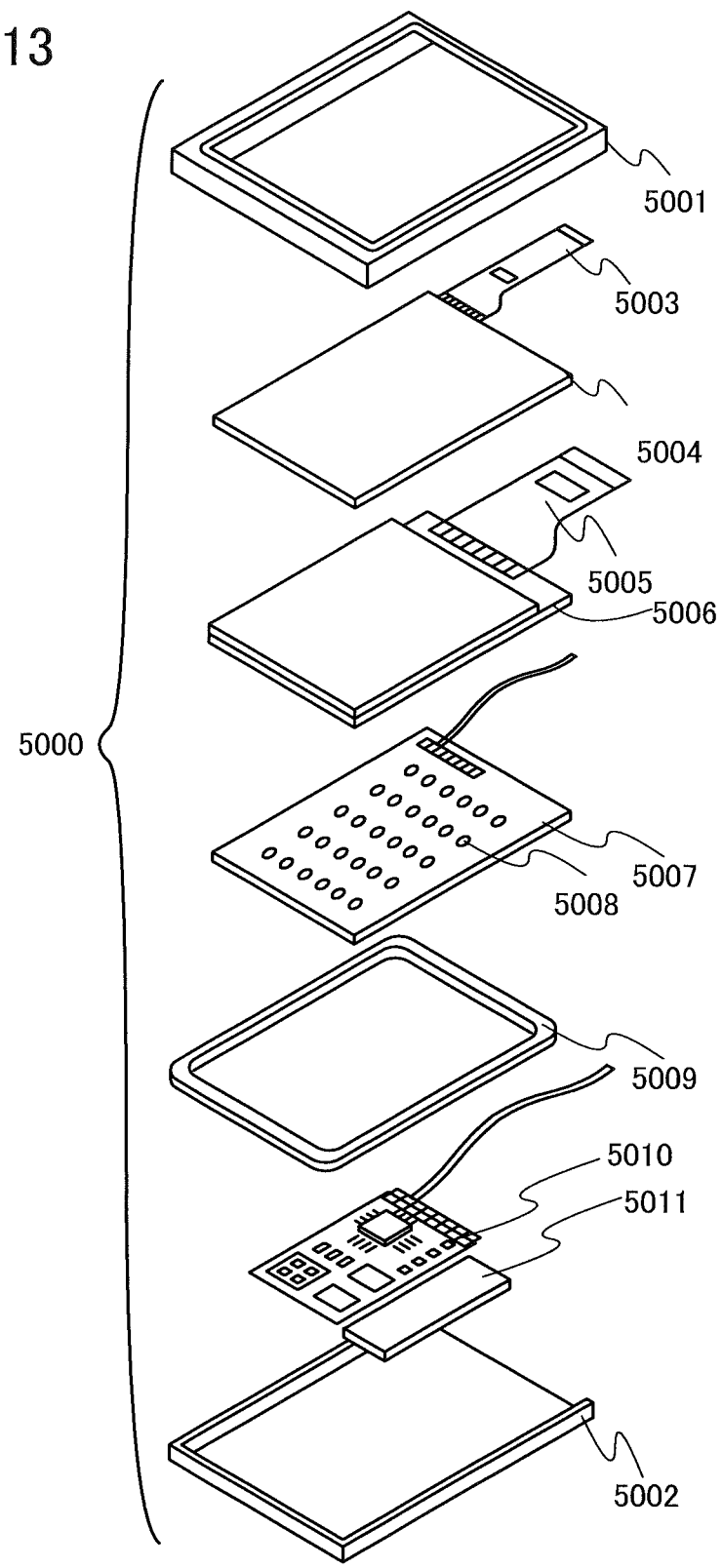
FIG. 13 illustrates a module using a light-emitting device of one embodiment of the present invention.

In a module 5000 in FIG. 13, a touch panel 5004 connected to an FPC 5003, a display panel 5006 connected to an FPC 5005, a backlight unit 5007, a frame 5009, a printed board 5010, and a battery 5011 are provided between an upper cover 5001 and a lower cover 5002.

The shapes and sizes of the upper cover 5001 and the lower cover 5002 can be changed as appropriate in accordance with the sizes of the touch panel 5004 and the display panel 5006.

The touch panel 5004 can be a resistive touch panel or a capacitive touch panel and may be formed so as to overlap with the display panel 5006. A counter substrate (sealing substrate) of the display panel 5006 can have a touch panel function. A photosensor may be provided in each pixel of the display panel 5006 so that the touch panel 5004 can function as an optical touch panel.

The backlight unit 5007 includes a light source 5008. Note that although a structure in which the light sources 5008 are placed over the backlight unit 5007 is illustrated in FIG. 13, one embodiment of the present invention is not limited to this structure. For example, a structure in which the light source 5008 is placed at an end portion of the backlight unit 5007 and a light diffusion plate is used may be employed.

The frame 5009 protects the display panel 5006 and functions as an electromagnetic shield for blocking electromagnetic waves generated by the operation of the printed board 5010. The frame 5009 may function as a radiator plate.

The printed board 5010 is provided with a power supply circuit and a signal processing circuit for outputting a video signal and a clock signal. As a power source for supplying power to the power supply circuit, an external commercial power source or a power source using the battery 5011 provided separately may be used. The battery 5011 can be omitted in the case of using a commercial power source.

The module 5000 can be additionally provided with a member such as a polarizing plate, a retardation plate, or a prism sheet.

Note that the structure described in this embodiment can be combined as appropriate with any of the structures described in the other embodiments and the examples.

Embodiment 8

In this embodiment, a structure of the light-emitting element of one embodiment of the present invention will be described with reference to FIGS. 14A and 14B.

Figure 14A:
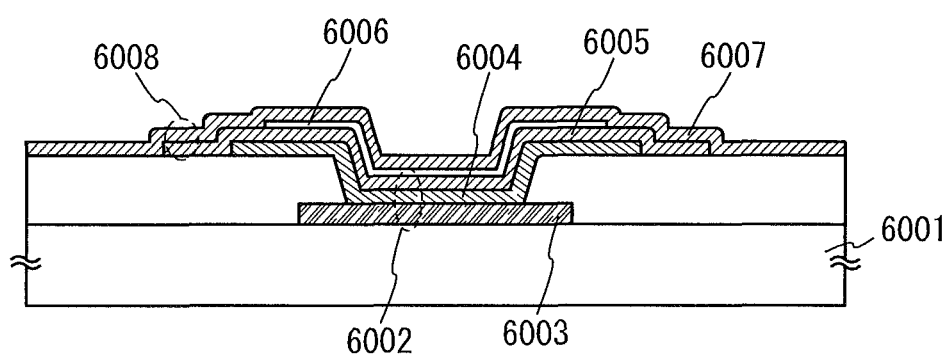
FIGS. 14A and 14B each illustrate a light-emitting element of one embodiment of the present invention.

A light-emitting element 6002 illustrated in FIG. 14A is formed over a substrate 6001. The light-emitting element 6002 includes a first electrode 6003, an EL layer 6004, and a second electrode 6005. Note that the EL layer may include two or more EL layers and an intermediate layer between every two EL layers. In the light-emitting device illustrated in FIG. 14A, a buffer layer 6006 is formed over the second electrode 6005, and a third electrode 6007 is formed over the buffer layer 6006. The buffer layer 6006 can prevent a decrease in light-extraction efficiency due to surface plasmon on a surface of the second electrode 6005.

Note that the second electrode 6005 and the third electrode 6007 are electrically connected to each other in a contact portion 6008. The position of the contact portion 6008 is not limited to the position in the drawing, and may be formed in a light-emitting region The first electrode 6003 functions as a cathode and the second electrode 6005 functions as an anode. Light can be extracted as long as at least one of the electrodes has a light-transmitting property, but the both may be formed with a light-transmitting material. In the case where the first electrode 6003 has a function of transmitting light from the EL layer 6004, an oxide transparent conductive film such as ITO can be used. In the case where the first electrode 6003 blocks light from the EL layer 6004, a conductive film formed by stacking a plurality of layers (e.g., ITO and silver) can be used.

In a structure in which light from the EL layer 6004 is extracted from the first electrode 6003 side, the thickness of the second electrode 6005 is preferably smaller than the thickness of the third electrode 6007. In a structure in which the light is extracted from the opposite side, the thickness of the second electrode 6005 is preferably larger than the thickness of the third electrode 6007. However, the thickness is not limited thereto.

For the buffer layer 6006, an organic film (e.g., Alq), an inorganic insulating material (e.g., a silicon nitride film), and the like can be used.

Figure 14B:
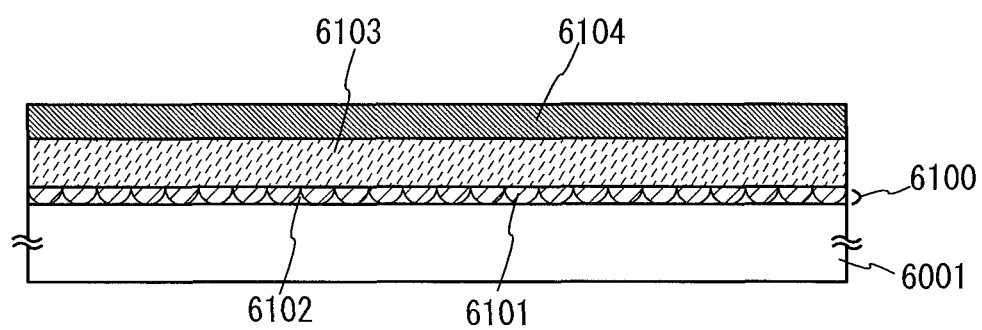

The light-extraction efficiency may be improved by employing a structure illustrated in FIG. 14B as a structure including the light-emitting element of one embodiment of the present invention.

In the structure illustrated in FIG. 14B, a light scattering layer 6100 including a light scatterer 6101 and an air layer 6102 is formed in contact with the substrate 6001; a high refractive index layer 6103 formed with an organic resin is formed in contact with the light scattering layer 6100; and an element layer 6104 including a light-emitting element and the like is formed in contact with the high refractive index layer 6103.

For the light scatterer 6101, particles such as ceramic particles can be used. For the high refractive index layer 6103, a high refractive index (e.g., refractive index greater than or equal to 1.7 and less than or equal to 1.8) material such as polyethylene naphthalate (PEN) can be used.

The element layer 6104 includes the light-emitting element described in Embodiment 1.

Example 1

A change in an emission spectrum by an electrode in contact with an EL layer will be described in one embodiment of the present invention.

Structural formulae and abbreviations of materials used in this example are shown below.

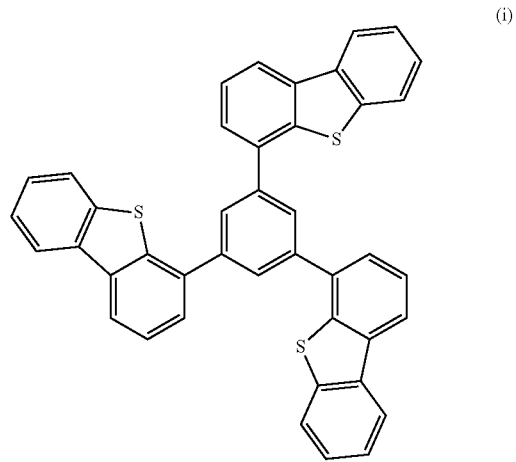

DBT3P-II (i)

(ii)
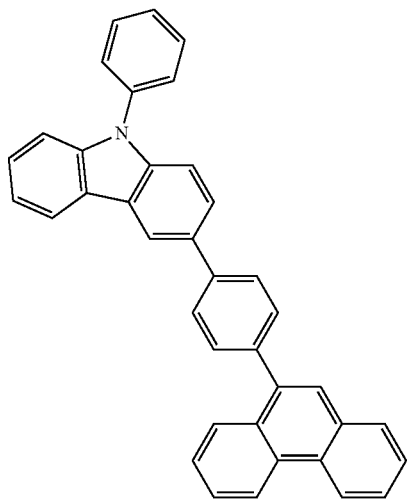
PCPPn
(iii)
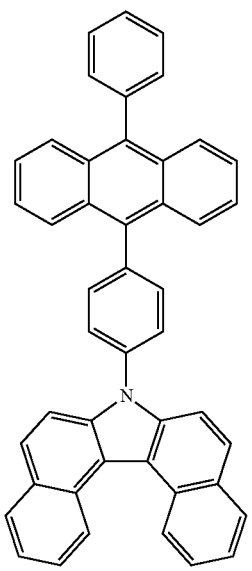
cgDBCzPA
(iv)
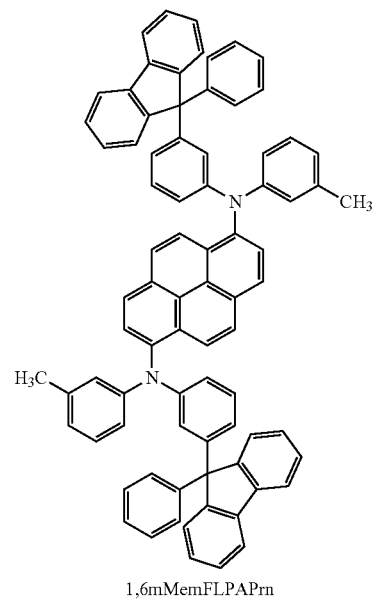
1,6mMemFLPAPrn
(v)
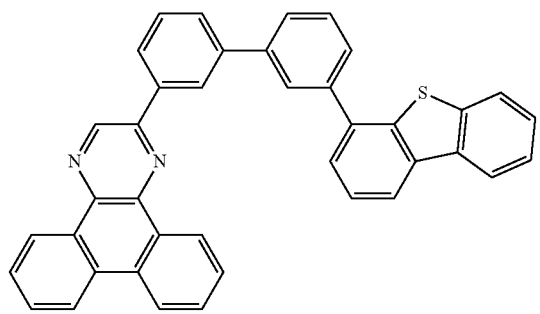
2mDBTBPDBq-II
(vi)
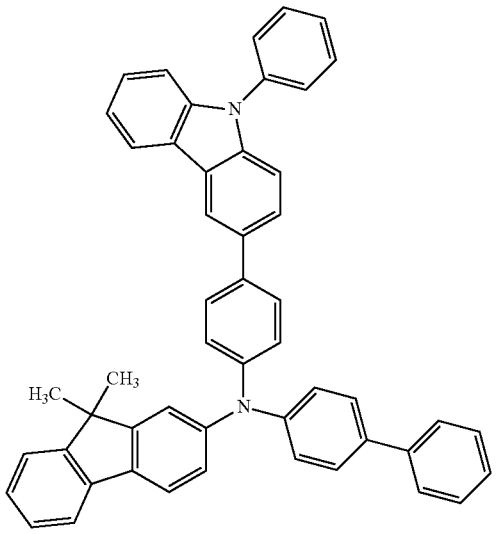
PCBBiF -continued

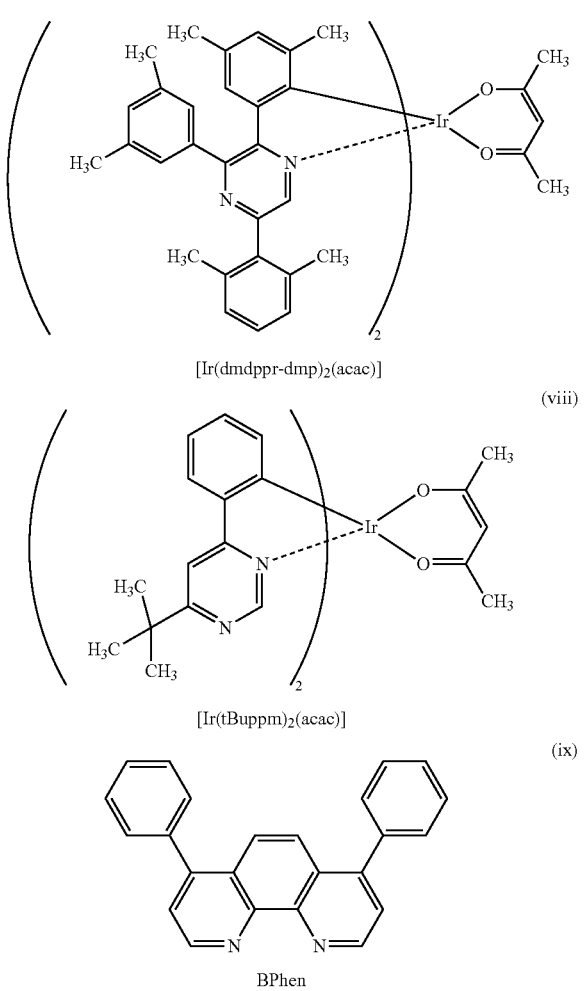

(vii) [Ir(dmdppr-dmp)₂(acac)]

(viii) [Ir(tBuppm)₂(acac)]

(ix) BPhen

<<Fabrication of Light-Emitting Element 1>>

A light-emitting element formed in this example is described with reference to FIG. 1B.

By a sputtering method, an Al—Ti film was formed over a glass substrate used as the substrate 100 to a thickness of 200 nm and then Ti was deposited thereover to a thickness of 6 nm. After Ti was deposited, baking was performed at 300° C. for 1 hour and further a film of indium tin oxide containing silicon oxide (ITSO) was formed to a thickness of 30 nm by a sputtering method, whereby the anode 121 was formed. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV ozone treatment was performed for 370 seconds.

Next, the substrate was fixed to a holder provided in a vacuum evaporation apparatus so that the surface of the substrate over which the ITSO film was formed faced downward. After that, the pressure inside the vacuum evaporation apparatus was reduced to approximately $10^{-4}$ Pa, vacuum baking at 170° C. for 60 minutes was performed in a heating chamber of the vacuum evaporation apparatus, and then the substrate was cooled down for approximately 30 minutes.

After the substrate was cooled, 4,4',4"-(benzene-1,3,5-triyl)tri(dibenzothiophene) (abbreviation: DBT3P-II) represented by the above structural formula (i) and molybdenum oxide were deposited by co-evaporation such that DBT3P-II:molybdenum oxide=1:0.5 (mass ratio). The thickness was set to be 10 nm. The film functions as the hole-injection layer 102.

Over the hole-injection layer 102, 3-[4-(9-phenanthryl)-phenyl]-9-phenyl-9H-carbazole (abbreviation: PCPPn), the condensed heteroaromatic compound represented by the above structural formula (ii) was deposited to a thickness of 10 nm. The film functions as the hole-transport layer 103.

Subsequently, the first light-emitting layer 104 was formed over the hole-transport layer 103. The first light-emitting layer 104 was formed by depositing N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by the above structural formula (iv) and 7-[4-(10-phenyl-9-anthryl)phenyl]-7H-dibenzo[c,g]carbazole (abbreviation: cgDBCzPA), the condensed polycyclic aromatic compound represented by the above structural formula (iii) by co-evaporation as an organic compound emitting fluorescence. The thickness of the first light-emitting layer 104 was 10 nm. The mass ratio of cgDBCzPA to 1,6mMem-FLPAPm was adjusted to 1:0.02 (=cgDBCzPA: 1,6mMem-FLPAPrnm).

Next, the layer 105 was formed over the first light-emitting layer 104 by depositing 2-[3'-(dibenzothiophen-4-yl)biphenyl-3-yl]dibenzo[f,h]quinoxaline (abbreviation: 2mDBTBPDBq-II), the condensed heteroaromatic compound represented by the above structural formula (v) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by the above structural formula (vi) by co-evaporation to a thickness of 2 nm such that the mass ratio of 2mDBTBPDBq-II to PCBBiF was adjusted to 0.8:0.2 (=2mDBTBPDBq-II:PCBBiF).

Next, the second light-emitting layer 106 was formed. The second light-emitting layer 106 was formed by depositing bis{4,6-dimethyl-2-[5-(2,6-dimethylphenyl)-3-(3,5-dimethylphenyl)-2-pyrazinyl-κN]phenyl-κC}(2,4-pentanedionato-κ²O,O')iridium(III) (abbreviation: [Ir(dmdppr-dmp)₂(acac)]) represented by the above structural formula (vii), 2mDBTBPDBq-II, and PCBBiF by co-evaporation as an organic compound emitting phosphorescence to a thickness of 5 nm such that the mass ratio of 2mDBTBPDBq-II to PCBBiF and [Ir(dmdppr-dmp)₂(acac)] was adjusted to 0.3:0.7:0.05 (=2mDBTBPDBq-II:PCBBiF:[Ir(dmdppr-dmp)₂(acac)]).

Next, the third light-emitting layer 107 was formed. The third light-emitting layer 107 was formed by depositing bis[2-(6-tert-butyl-4-pyrimidinyl-κN3)phenyl-κC](2,4-pentanedionato-²O,O')iridium(I)) (abbreviation: [Ir(tBuppm)₂(acac)]) represented by the above structural formula (viii), 2mDBTBPDBq-II, and PCBBiF by co-evaporation as an organic compound emitting phosphorescence to a thickness of 20 nm such that the mass ratio of 2mDBTBPDBq-II to PCBBiF and [Ir(tBuppm)₂(acac)] was adjusted to 0.6:0.4:0.05 (=2mDBTBPDBq-II:PCBBiF:[Ir(tBuppm)₂(acac)]).

The electron-transport layer 108 was formed by depositing 2mDBTBPDBq-II by evaporation to a thickness of 5 nm over the third light-emitting layer 107.

Next, over the electron-transport layer 108, bathophenanthroline (abbreviation: BPhen) was deposited by evaporation to a thickness of 5 nm, and lithium oxide (Li₂O) was further deposited thereover by evaporation to a thickness of 0.1 nm, thereby forming the electron-injection layer 109.

Then, although not illustrated in FIG. 1B, copper phthalocyanine (abbreviation: CuPc) was deposited by evaporation over the electron-injection layer 109 to a thickness of 2 nm, thereby forming an electron-relay layer. Furthermore, although not illustrated in FIG. 1B, DBT3P-II and molybdenum oxide were deposited by co-evaporation over the electron-relay layer to a thickness of 35 nm such that the mass ratio of DBT3P-II to molybdenum oxide was DBT3P-II:molybdenum oxide=1:0.5. The layer functions as a charge-generation/hole-injection layer.

influence emission spectra. The difference in the thickness of the hole-injection layer 102 gives to the same light pass lengths in these light-emitting elements 1 and 2, which indicates the same degree of optical modulation of light emitted from the respective light-emitting layers. Therefore, the effect of the difference in a material of the electrode on an emission spectrum was able to be examined by eliminating the effect of another factor as much as possible.

Table 1 shows the stacked-layer structures of the light-emitting element 1 and the light-emitting element 2.

TABLE 1

|  | anode 121 | hole injection layer 102 | hole-transport layer 103 | 1st light-emitting lyaer 104 | layer 105 |
|---|---|---|---|---|---|
| Element 1 | Al—Ti\Ti (200 nm\6 nm) | ITSO (30 nm) | DBT3P-II:MoOx (1:0.5, 10 nm) | PCPPn (10 nm) | *1 | *2 |
| Element 2 | Al—Ti\Ti (200 nm\6 nm) | | DBT3P-II:MoOx (1:0.5, 45 nm) | | | |

|  | 2nd light-emitting layer 106 | 3rd light-emitting layer 107 | electron-transport layer 108 | electron-injection layer 109 | electron-relay layer | charge-generation and hole-injection layer | cathode 123 |
|---|---|---|---|---|---|---|---|
| Element 1 | *3 | *4 | 2mDBTBPDBq-II (5 nm) | BPhen (5 nm) | $Li_2O$ (0.1 m) | CuPc (2 nm) | DBT3P-II:MoOx (1:0.5 35 nm) | ITO (70 nm) |
| Element 2 | | | | | | | | |

*1 cgDBCzPA:1,6mMemFLPAPrn (1:0.02, 10 nm)
*2 2mDBTBPDBq-II:PCBBiF (0.8:0.2, 2 nm)
*3 2mDBTBPDBq-II:PCBBiF:[Ir(dmdppr-dmp)$_2$(acac)] (0.3:0.7:0.05, 5 nm)
*4 2mDBTBPDBq-II:PCBBiF:[Ir(tBuppm)$_2$(acac)] (0.6:0.4:0.05, 20 nm)

Next, indium-tin oxide (ITO) was deposited to a thickness of 70 nm by a sputtering method, thereby forming the cathode 123.

The light-emitting element 1 was completed with the anode 121, the hole-injection layer 102, the hole-transport layer 103, the first light-emitting layer 104, the layer 105, the second light-emitting layer 106, the third light-emitting layer 107, the electron-transport layer 108, the electron-injection layer 109, the electron-relay layer, the charge-generation/hole-injection layer, and the cathode 123. Note that in all the examples in this specification, evaporation was performed by a resistance-heating method. The ITO deposited as the cathode 123 was formed by a sputtering method.

In the above manner, the light-emitting element 1 was fabricated.

<<Fabrication of Light-Emitting Element 2>>

Next, a light-emitting element 2 is described. The light-emitting element 2 was fabricated in a manner similar to that of the light-emitting element 1. However, the light-emitting element 2 is different from the light-emitting element 1 in that a film of indium tin oxide containing silicon oxide (ITSO) was not formed in the anode 121, whereas the hole-injection layer 102 was formed to a thickness of 45 nm without changing the material.

In the light-emitting element 1 and the light-emitting element 2, the anode 121 in contact with the EL layer in the light-emitting element 1 is formed using ITSO, whereas that in the light-emitting element 2 is formed using Ti. Since ITSO and Ti have different work functions, their carrier-injection properties (hole-injection properties) to the respective EL layers are different. The effect of this difference on emission spectra will be described later.

The thickness of the hole-injection layer 102 in the light-emitting element 1 largely differs from that in the light-emitting element 2. However, the difference between the thicknesses of the hole-injection layers 102 does not The material used for the anode in contact with the EL layer is different between the light-emitting element 1 and the light-emitting element 2, i.e. ITSO is used in the light-emitting element 1, whereas Ti is used in the light-emitting element 2. The work function of Ti is lower than that of ITSO; therefore, injection properties of carriers (in this case, holes) of Ti also is lower than those of ITSO.

<<Emission Spectra of Light-Emitting Elements 1 and 2>>

Figure 15:
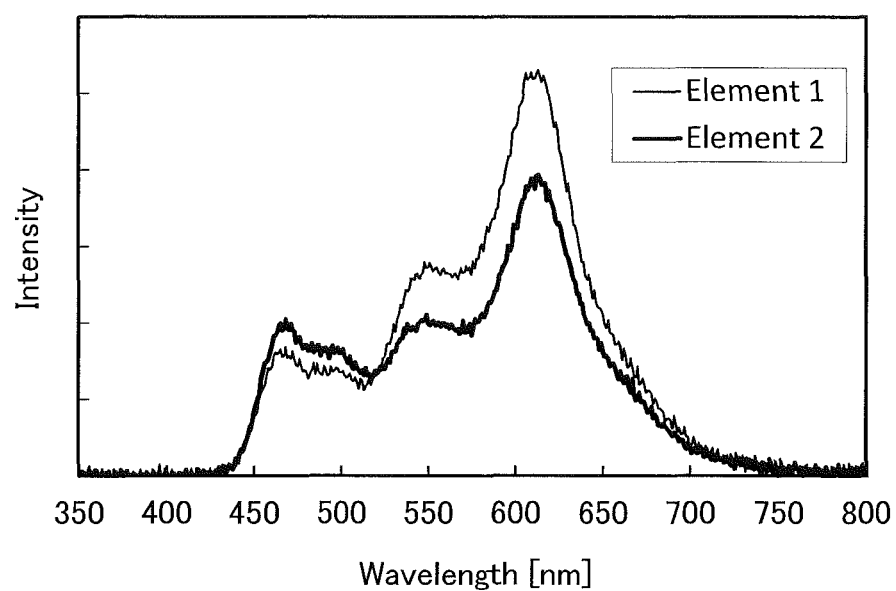
FIG. 15 shows emission spectra of a light-emitting element 1 and a light-emitting element 2.

FIG. 15 shows emission spectra of the light-emitting element 1 and the light-emitting element 2. As shown in FIG. 15, the peak wavelengths and the peak shapes of emission peaks of the spectra of the elements are substantially the same, whereas the emission intensities of the peaks are different.

Specifically, the intensity of an emission peak in a blue wavelength range of around 470 nm of the light-emitting element 2 using Ti having a relatively low work function was higher than that of the light-emitting element 1 using ITSO having a high work function. In contrast, the intensities of emission peaks in wavelength ranges of around 550 nm and 610 nm of the light-emitting element 2 were lower.

Figure 16:
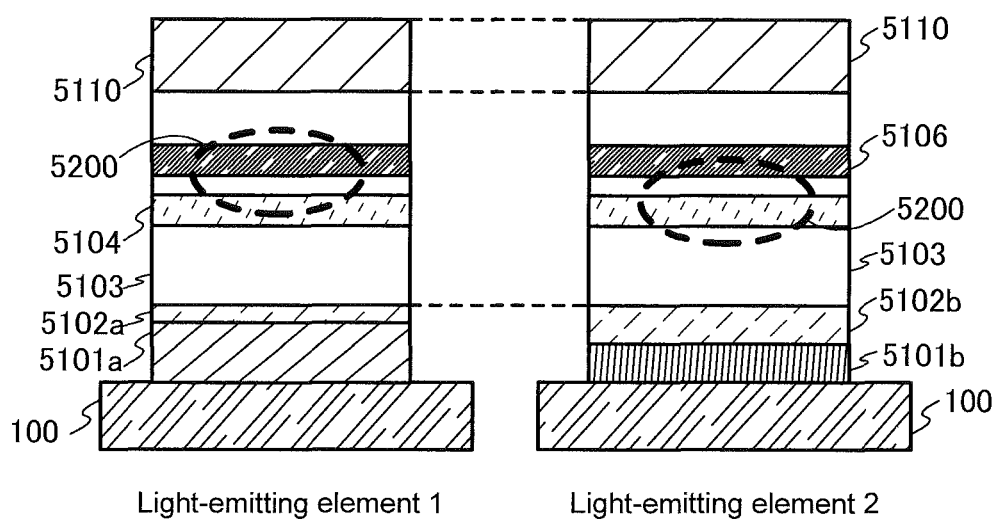
FIG. 16 illustrates distribution of regions in which carriers are recombined.

The results will be described with reference to FIG. 16. FIG. 16 illustrates the stacked-layer structures of the EL layers. In the light-emitting element 1, a carrier-injection property of an anode 5101a is high compared with that in the light-emitting element 2 and distribution of a region 5200 in which carriers are recombined is localized on a cathode 5110 side, whereas in the light-emitting element 2, a carrier-injection property of an anode 5101b is low and distribution of a region 5200 in which carriers are recombined is localized on the anode 5101b side. Therefore, in the light-emitting element 2, the relative intensity of light emitted from a blue light-emitting layer 5104 that exists on the anode 5101b side becomes higher, whereas that of light emitted from another light-emitting layer 5106 different from the blue light-emitting layer 5104 that exists on the cathode 5110 side becomes lower.

In the case where the EL layer includes one light-emitting layer, the shape of spectrum of light emitted from the EL layer does not change depending on distribution of a region in which carriers are recombined and thus color is not changed. However, in the case where the EL layer includes two or more light-emitting layers, the ratio of intensities of light of each color is changed depending on distribution of regions in which carriers are recombined. Therefore, the material of the anode is selected so that the region in which carriers are recombined is distributed in accordance with a desired light wavelength; accordingly, emission color of the element can be controlled.

As described above, this example showed a relation between the work function (a carrier-injection property) of the electrode and an emission spectrum of the EL layer. Therefore, for example, the structure of the light-emitting element 2 is used for a blue subpixel of a display and the structure of the light-emitting element 1 is used for another subpixel other than the blue subpixel of the display, whereby light of color of each subpixel can be extracted easily and thus power consumption of the display can be suppressed.

Example 2

In this example, the work function of a material used for the anode in contact with the EL layer will be described. Specifically, measurement results of the work functions of ITSO and Ti are shown and the magnitude relation will be described.

First, measurement samples are described. ITSO and Ti which were used for measurement were deposited over glass substrates each to a thickness of 100 nm by a sputtering method. Note that the composition of a target used for the deposition of ITSO was $In_2O_3:SnO_2:SiO_2=85:10:5$ (wt %).

Next a measurement method and measurement conditions for the work function are described. As the measurement method, an ultraviolet photoelectron spectroscopy (UPS) was used. As a measurement apparatus, a multi-technique photoelectron spectroscopy (ESCA-5800) manufactured by ULVAC-PHI, Inc. was used. As measurement conditions, an ultraviolet light source was HeI (21.22 eV), the analysis area was $\phi 800$ μm, the analysis depth was approximately 1 nm, and the bias voltage was −10 V. Note that the sample was subjected to sputtering cleaning before the measurement.

As a result of the measurement, the work function of ITSO was 5.7 eV and the work function of Ti was 4.7 eV, i.e. the work function of Ti was lower than that of ITSO. Therefore, when used as the anode of the EL element, the carrier-injection property of ITSO was higher than that of Ti. Thus, a region in which carriers were recombined was distributed in the EL layer in a position closer to the anode when Ti was used as the anode than when ITSO was used as the anode.

When a region in which carriers are recombined is distributed in the light-emitting layer of the EL layer, light might be emitted from the light-emitting layer. Therefore, when the EL layer includes a plurality of light-emitting layers, Ti used for the anode is more advantageous to light emission in the light-emitting layer close to the anode than ITSO used for the anode. In a region which is formed to extract light emitted from the light-emitting layer, power consumption for light emission can be reduced and emission efficiency of the element can be increased.

Example 3

In this example, characteristics of an element of one embodiment of the present invention were further evaluated.

Materials used in this example for the EL layer are the same as the materials whose structural formulae and abbreviations are shown in Example 1.

<<Fabrication of Light-Emitting Element 3>>

A light-emitting element formed in this example is described with reference to FIG. 1B.

By a sputtering method, an Al—Ti film was formed over a glass substrate used as the substrate 100 to a thickness of 200 nm and then Ti was deposited thereover to a thickness of 6 nm. After the Ti film was formed, baking was performed at 300° C. for 1 hour and further a film of indium tin oxide containing silicon oxide (ITSO) was formed to a thickness of 40 nm by a sputtering method, whereby the anode 121 was formed. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV ozone treatment was performed for 370 seconds.

Next, the substrate was fixed to a holder provided in a vacuum evaporation apparatus so that the surface of the substrate over which the ITSO film was formed faced downward. After that, the pressure inside the vacuum evaporation apparatus was reduced to approximately $10^{-4}$ Pa, vacuum baking at 170° C. for 60 minutes was performed in a heating chamber of the vacuum evaporation apparatus, and then the substrate was cooled down for approximately 30 minutes.

After the substrate was cooled, 4,4',4"-(benzene-1,3,5-triyl)tri(dibenzothiophene) (abbreviation: DBT3P-II) and molybdenum oxide were deposited by co-evaporation such that DBT3P-II:molybdenum oxide=1:0.5 (mass ratio). The thickness was set to be 55 nm. The film functions as the hole-injection layer 102.

Over the hole-injection layer 102, 3-[4-(9-phenanthryl)-phenyl]-9-phenyl-9H-carbazole (abbreviation: PCPPn) was deposited to a thickness of 10 nm. The film functions as the hole-transport layer 103.

Subsequently, the first light-emitting layer 104 was formed over the hole-transport layer 103. The first light-emitting layer 104 was formed by depositing N,N'-bis(3-methylphenyl)-N,N-bis[3-(9-phenyl-9H-fluoren-9-yl)phenyl]-pyrene-1,6-diamine (abbreviation: 1,6mMemFLPAPm) and 7-[4-(10-phenyl-9-anthryl)phenyl]-7H-dibenzo[c,g]carbazole (abbreviation: cgDBCzPA) by co-evaporation. The thickness of the first light-emitting layer 104 was 10 nm. The mass ratio of cgDBCzPA to 1,6mMemFLPAPrn was adjusted to 1:0.02 (=cgDBCzPA:1,6mMemFLPAPm).

Next, the layer 105 was formed over the first light-emitting layer 104 by depositing 2-[3'-(dibenzothiophen-4-yl)biphenyl-3-yl]dibenzo[f,h]quinoxaline (abbreviation: 2mDBTBPDBq-II) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) by co-evaporation to a thickness of 2 nm such that the mass ratio of 2mDBTBPDBq-II to PCBBiF was adjusted to 0.8:0.2 (=2mDBTBPDBq-II: PCBBiF).

Next, the second light-emitting layer 106 was formed. The second light-emitting layer 106 was formed by depositing bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium(III) (abbreviation: [Ir(dmdppr-dmp)$_2$(acac)]), 2mDBTBPDBq-II, and PCBBiF by co-evaporation as an organic compound emitting phosphorescence to a thickness of 5 nm such that the mass ratio of 2mDBTBPDBq-II to PCBBiF and [Ir(dmdppr-dmp)₂(acac)] was adjusted to 0.3:0.7:0.05 (=2mDBTBPDBq-II:PCBBiF:[Ir(dmdppr-dmp)₂(acac)]).

Next, the third light-emitting layer 107 was formed. The third light-emitting layer 107 was formed by depositing bis[2-(6-tert-butyl-4-pyrimidinyl-κN3)phenyl-κC](2,4-pentanedionato-κ²O,O')iridium(III)) (abbreviation: [Ir(tBuppm)₂ (acac)]) represented by the structural formula (viii), 2mDBTBPDBq-II, and PCBBiF by co-evaporation as an organic compound emitting phosphorescence to a thickness of 20 nm such that the mass ratio of 2mDBTBPDBq-II to PCBBiF and [Ir(tBuppm)₂(acac)] was adjusted to 0.6:0.4:0.05 (=2mDBTBPDBq-II:PCBBiF:[Ir(tBuppm)₂(acac)]).

The electron-transport layer 108 was formed by depositing 2mDBTBPDBq-II by evaporation to a thickness of 10 nm over the third light-emitting layer 107.

Next, over the electron-transport layer 108, bathophenanthroline (abbreviation: BPhen) was deposited by evaporation to a thickness of 25 nm, and lithium fluoride (LiF) was further deposited by evaporation to a thickness of 1 nm, thereby forming the electron-injection layer 109.

Next, silver (Ag) and magnesium (Mg) were deposited by co-evaporation to a thickness of 15 nm such that Ag:Mg=1:0.1 (volume ratio), and then indium-tin oxide (ITO) was deposited to a thickness of 70 nm by a sputtering method, thereby forming the cathode 123.

The light-emitting element 3 was completed with the anode 121, the hole-injection layer 102, the hole-transport layer 103, the first light-emitting layer 104, the layer 105, the second light-emitting layer 106, the third light-emitting layer 107, the electron-transport layer 108, the electron-injection layer 109, and the cathode 123. Note that in all the examples in this specification, evaporation was performed by a resistance-heating method. The ITO deposited as the cathode 123 was formed by a sputtering method.

In the above manner, the light-emitting element 3 was fabricated.

<<Light-Emitting Element 4>>

Next, a light-emitting element 4 is described. The light-emitting element 4 was fabricated in a manner similar to that of the light-emitting element 3. However, the light-emitting element 4 is different from the light-emitting element 3 in that a film of indium tin oxide containing silicon oxide (ITSO) was not formed in the anode 121, whereas the hole-injection layer 102 was formed to a thickness of 102.5 nm without changing the material.

In the light-emitting element 3 and the light-emitting element 4, the anode 121 in contact with the EL layer in the light-emitting element 1 is formed using ITSO, whereas that in the light-emitting element 4 is formed using Ti. Since ITSO and Ti have different work functions, their carrier-injection properties (hole-injection properties) to the respective EL layers are different. The effect of this difference on emission spectra will be described later.

The thickness of the hole-injection layer 102 in the light-emitting element 3 largely differs from that in the light-emitting element 4. However, the difference between the thicknesses of the hole-injection layers 102 does not influence emission spectra. The difference in the thickness of the hole-injection layer 102 gives the same light pass lengths of the light-emitting elements 3 and 4, which indicates the same degree of optical modulation of light emitted from the respective light-emitting layers. Therefore, the effect of the difference in a material of the electrode on an emission spectrum was examined by eliminating the effect of another factor as much as possible.

Table 2 shows the stacked-layer structures of the light-emitting element 3 and the light-emitting element 4.

TABLE 2

|  | anode 121 | hole injection layer 102 | hole-transport layer 103 | 1st light-emitting layer 104 | layer 105 |
|---|---|---|---|---|---|
| Element 3 | Al—Ti\Ti (200 nm\6 nm) | ITSO (40 nm) | DBT3P-II:MoOx (1:0.5 55 nm) | PCPPn (10 nm) | *1 | *2 |
| Element 4 | Al—Ti\Ti (200 nm\6 nm) |  | DBT3P-II:MoOx (1:0.5 102.5 nm) |  |  |

|  | 2nd light-emitting layer 106 | 3rd light-emitting layer 107 | electron-transport layer 108 | electron-injection layer 109 |  | cathode 123 |
|---|---|---|---|---|---|---|
| Element 3 | *3 | *4 | 2mDBTBPDBq-II (10 nm) | BPhen (25 nm) | LiF (1 nm) | Ag:Mg (1:0.1 15 nm) | ITO (70 nm) |
| Element 4 |  |  |  |  |  |  |

*1 cgDBCzPA:1,6mMemFLPAPrn (1:0.02, 10 nm)
*2 2mDBTBPDBq-II:PCBBiF (0.8:0.2, 2 nm)
*3 2mDBTBPDBq-II:PCBBiF:[Ir(dmdppr-dmp)₂(acac)] (0.3:0.7:0.05, 5 nm)
*4 2mDBTBPDBq-II:PCBBiF:[Ir(tBuppm)₂(acac)] (0.6:0.4:0.05, 20 nm)

The material used for the anode in contact with the EL layer is different between the light-emitting element 1 and the light-emitting element 2, i.e. ITSO is the anode of the light-emitting element 3, whereas Ti is the anode of the light-emitting element 4. The work function of Ti is lower than that of ITSO; therefore, injection properties of carriers (in this case, holes) of Ti is also lower than those of ITSO.

<<Emission Spectra of Light-Emitting Elements 3 and 4>>

Measurement results of emission spectra and element characteristics of the fabricated light-emitting elements 3 and 4 are described, and a blue color filter was provided in an optical path for measurement in Example 2. The optical path lengths in the EL layers were made substantially the same in both of the light-emitting elements, whereby a microcavity effect that relatively intensifies blue light emission was generated equally in both of the light-emitting elements. That is, for example, it was made possible to evaluate measurement results of both light-emitting elements with assumption of a situation where such a structure is used in a blue subpixel in a display device utilizing EL emission. Note that as the blue color filter, a known color filter that can transmit light in a wavelength range of 400 nm or more and 530 nm or less was used.

Figure 17:
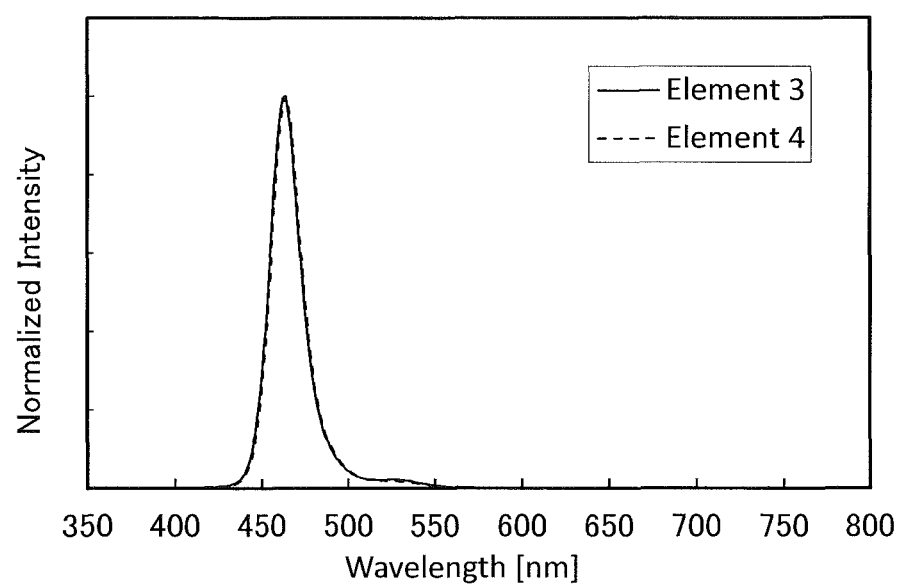
FIG. 17 shows normalized emission spectra of a light-emitting element 3 and a light-emitting element 4.

FIG. 17 shows normalized emission spectra of the light-emitting element 3 and the light-emitting element 4. As shown in FIG. 17, the peak wavelengths and the peak shapes of emission spectra of the elements were also the same appropriately, and the shapes of the spectra were also the same appropriately.

Table 3 shows the element characteristics of the light-emitting element 3 and the light-emitting element 4.

TABLE 3

|  | Voltage (V) | Current (mA) | Current density (mA/cm$^2$) | Chromaticity (x, y) | Luminance (cd/m$^2$) | Current efficiency (cd/A) |
| --- | --- | --- | --- | --- | --- | --- |
| Light-emitting element 3 | 4.9 | 2.6 | 65 | (0.14, 0.077) | 1000 | 1.5 |
| Light-emitting element 4 | 5.0 | 2.3 | 57 | (0.14, 0.076) | 1000 | 1.8 |

The measurement results showed that the current efficiency of the light-emitting element 4 is higher than that of the light-emitting element 3 by ca. 20%. The same discussion as Example 1 was omitted. However, since light that was transmitted through the blue color filter was evaluated in this Example 2, a difference of emission efficiency in a blue region was evaluated accurately.

In a display device or the like by a white EL+ color filter method, by controlling distribution of a region in which carriers are recombined with a carrier-injection property of an anode, a material used for the anode can be selected in accordance with a desired emission wavelength. Emission efficiency of the display device or the like was increased and power consumption of the display device or the like was reduced by one embodiment of the present invention.

This application is based on Japanese Patent Application serial no. 2014-162549 filed with Japan Patent Office on Aug. 8, 2014, the entire contents of which are hereby incorporated by reference.

What is claimed is:

1. A light-emitting device comprising:
    a first light-emitting element comprising:
        a first electrode;
        an EL layer over and in contact with the first electrode; and
        a second electrode over the EL layer, and
    a second light-emitting element comprising:
        the first electrode;
        a transmitting layer over the first electrode;
        the EL layer over the transmitting layer, and
        the second electrode over the EL layer,
    wherein the first electrode has a reflective property,
    wherein the second electrode has a light-transmitting property,
    wherein the EL layer comprises a first light-emitting layer,
    wherein the first light-emitting layer comprises a second light-emitting layer and a third light-emitting layer,
    wherein the second light-emitting layer comprises a first light-emitting material,
    wherein the third light-emitting layer comprises a second light-emitting material,
    wherein an emission peak wavelength of the first light-emitting material is shorter than an emission peak wavelength of the second light-emitting material, and
    wherein a distribution of a region in which carriers are recombined in the first light-emitting element is different from a distribution of a region in which carriers are recombined in the second light-emitting element.

2. The light-emitting device according to claim 1, wherein a peak wavelength of emission from the first light-emitting element is shorter than a peak wavelength of emission from the second light-emitting element.

3. The light-emitting device according to claim 1, wherein the second electrode comprises a metal film.

4. The light-emitting device according to claim 1,
    wherein the first light-emitting layer further comprises a first layer between the second light-emitting layer and the third light-emitting layer, and
    wherein the first layer does not comprises both the first light-emitting material and the second light-emitting material.

5. The light-emitting device according to claim 1,
    wherein the EL layer further comprises a second layer in contact with the first electrode in the first light-emitting element, and
    wherein the second layer comprises an acceptor substance.

6. The light-emitting device according to claim 5, wherein the second layer comprises two layers.

7. The light-emitting device according to claim 1,
    wherein the first electrode comprises titanium, and
    wherein the transmitting layer comprises indium, tin and oxygen.

8. The light-emitting device according to claim 1,
    wherein the first light-emitting material is a fluorescent light-emitting material, and
    wherein the second light-emitting material is a phosphorescent light-emitting material.

9. The light-emitting device according to claim 1, wherein the first light-emitting element emits blue light.

10. The light-emitting device according to claim 1,
    wherein the first light-emitting element further comprises a first color filter,
    wherein the second light-emitting element further comprises a second color filter,
    wherein the first color filter is capable of transmitting light with a first color,
    wherein the second color filter is capable of transmitting light with a second color, and
    wherein the first color is different from the second color.

11. The light-emitting device according to claim 1, wherein the third light-emitting layer is positioned over the second light-emitting layer.

12. The light-emitting device according to claim 1,
    wherein the first electrode of the first light-emitting element is electrically connected to a first transistor, and
    wherein the first electrode of the first light-emitting element is electrically connected to a second transistor.

13. A display panel comprising:
the light-emitting device according to claim 1; and
a driver circuit.

14. A lighting device comprising:
the light-emitting device according to claim 1; and
a power switch.

15. An electronic appliance comprising:
the display panel according to claim 13; and
an operation button.

16. A light-emitting device comprising:
a first light-emitting element comprising:
   a first electrode;
   an EL layer over and in contact with the first electrode; and
   a second electrode over the EL layer, and
a second light-emitting element comprising:
   the first electrode;
   a transmitting layer over the first electrode;
   the EL layer over the transmitting layer, and
   the second electrode over the EL layer,
wherein the first electrode has a reflective property,
wherein the second electrode has a light-transmitting property,
wherein the EL layer comprises:
   a hole-injection layer in contact with the first electrode in the first light-emitting element;
   a hole-transport layer in contact with the hole-injection layer, and
   a first light-emitting layer in contact with the hole-transport layer,
wherein the hole-injection layer comprises an acceptor substance,
wherein the first light-emitting layer comprises a second light-emitting layer and a third light-emitting layer,
wherein the second light-emitting layer comprises a first light-emitting material,
wherein the third light-emitting layer comprises a second light-emitting material,
wherein an emission peak wavelength of the first light-emitting material is shorter than an emission peak wavelength of the second light-emitting material, and
wherein a distribution of a region in which carriers are recombined in the first light-emitting element is different from a distribution of a region in which carriers are recombined in the second light-emitting element.

17. The light-emitting device according to claim 16, wherein a peak wavelength of emission from the first light-emitting element is shorter than a peak wavelength of emission from the second light-emitting element.

18. The light-emitting device according to claim 16,
wherein the first light-emitting material is a fluorescent light-emitting material,
wherein the second light-emitting material is a phosphorescent light-emitting material
wherein the first light-emitting layer further comprises a first layer between the second light-emitting layer and the third light-emitting layer, and
wherein the first layer does not comprises both the first light-emitting material and the second light-emitting material.

19. The light-emitting device according to claim 16, wherein the hole-injection layer comprises two layers.

20. The light-emitting device according to claim 16,
wherein the first light-emitting element further comprises a first color filter,
wherein the second light-emitting element further comprises a second color filter,
wherein the first color filter is capable of transmitting light with a first color,
wherein the second color filter is capable of transmitting light with a second color, and
wherein the first color is different from the second color.

21. The light-emitting device according to claim 16, wherein the third light-emitting layer is positioned over the second light-emitting layer.

22. The light-emitting device according to claim 16,
wherein the first electrode of the first light-emitting element is electrically connected to a first transistor, and
wherein the first electrode of the first light-emitting element is electrically connected to a second transistor.

23. A display panel comprising:
the light-emitting device according to claim 16; and
a driver circuit.

24. A lighting device comprising:
the light-emitting device according to claim 16; and
a power switch.

25. An electronic appliance comprising:
the light-emitting device according to claim 16; and
an operation button.

* * * * *